(12) United States Patent
Shinohara et al.

(10) Patent No.: US 8,368,103 B2
(45) Date of Patent: Feb. 5, 2013

(54) COMPOUND SEMICONDUCTOR LIGHT-EMITTING ELEMENT AND METHOD OF MANUFACTURING THE SAME, CONDUCTIVE TRANSLUCENT ELECTRODE FOR COMPOUND SEMICONDUCTOR LIGHT-EMITTING ELEMENT, LAMP, ELECTRONIC DEVICE, AND MECHANICAL APPARATUS

(75) Inventors: Hironao Shinohara, Ichihara (JP); Naoki Fukunaga, Munakata (JP); Yasunori Yokoyama, Ichihara (JP)

(73) Assignee: Showa Denko K.K., Tokyo (JP)

( * ) Notice: Subject to any disclaimer, the term of this patent is extended or adjusted under 35 U.S.C. 154(b) by 126 days.

(21) Appl. No.: 12/864,440

(22) PCT Filed: Jan. 23, 2009

(86) PCT No.: PCT/JP2009/051062
§ 371 (c)(1), (2), (4) Date: Jul. 23, 2010

(87) PCT Pub. No.: WO2009/093683
PCT Pub. Date: Jul. 30, 2009

(65) Prior Publication Data
US 2010/0295086 A1    Nov. 25, 2010

(30) Foreign Application Priority Data

Jan. 24, 2008  (JP) .................................. 2008-014232
Mar. 17, 2008  (JP) .................................. 2008-068076
Oct. 23, 2008  (JP) .................................. 2008-273092

(51) Int. Cl.
*H01L 33/00*     (2010.01)

(52) U.S. Cl. .................. 257/98; 257/103; 257/E33.023; 257/E33.067

(58) Field of Classification Search .................... 257/98, 257/103, E33.023, E33.067
See application file for complete search history.

(56) References Cited

U.S. PATENT DOCUMENTS 6,669,830 B1  12/2003  Inoue et al.
6,821,655 B1  11/2004  Ohta et al.
(Continued)

FOREIGN PATENT DOCUMENTS

CN    1510765 A    7/2004
JP    08-217578 A    8/1996
(Continued)

OTHER PUBLICATIONS

Office Action (Notice of Preliminary Rejection) dated Aug. 10, 2011 for corresponding Korean Patent Application No. 10-2010-7016335.

(Continued)

*Primary Examiner* — Eugene Lee
*Assistant Examiner* — Elias M Ullah
(74) *Attorney, Agent, or Firm* — Sughrue Mion, PLLC

(57) ABSTRACT

The invention provides a compound semiconductor light-emitting element including: a substrate on which an n-type semiconductor layer (12), a light-emitting layer (13), and a p-type semiconductor layer (14) that are made of a compound semiconductor are stacked in this order; a positive electrode (15) made of a conductive translucent electrode; and a negative electrode (17) made of a conductive electrode, wherein the conductive translucent electrode of the positive electrode (15) is a transparent conductive film containing crystals composed of $In_2O_3$ having a hexagonal crystal structure.

18 Claims, 13 Drawing Sheets

U.S. PATENT DOCUMENTS

2007/0241321 A1    10/2007    Kuo

FOREIGN PATENT DOCUMENTS

| | | | |
|---|---|---|---|
| JP | 2000-196152 | A | 7/2000 |
| JP | 2001-089846 | A | 4/2001 |
| JP | 2001-215523 | A | 8/2001 |
| JP | 2004-075427 | A | 3/2004 |
| JP | 2004-299963 | A | 10/2004 |
| JP | 2005-123501 | A | 5/2005 |
| JP | 2005-197505 | A | 7/2005 |
| JP | 2007-287845 | A | 11/2007 |
| JP | 2008-066276 | A | 3/2008 |
| JP | 2008-147459 | * | 6/2008 |
| KR | 1020060112064 | A | 10/2006 |
| WO | 01/38599 | A1 | 5/2001 |
| WO | 2008/072681 | A1 | 6/2008 |

OTHER PUBLICATIONS

Chinese Office Action dated Oct. 26, 2011 for corresponding Chinese Patent Application No. 200980110336.0.

Taiwanese Office Action dated Aug. 24, 2010 issued in Taiwanese Patent Application No. 098103109.

* cited by examiner

COMPOUND SEMICONDUCTOR LIGHT-EMITTING ELEMENT AND METHOD OF MANUFACTURING THE SAME, CONDUCTIVE TRANSLUCENT ELECTRODE FOR COMPOUND SEMICONDUCTOR LIGHT-EMITTING ELEMENT, LAMP, ELECTRONIC DEVICE, AND MECHANICAL APPARATUS

TECHNICAL FIELD

The present invention is preferably used in a light emitting diode (LED), a laser diode (LD), an electronic device, or the like. The present invention relates to a compound semiconductor light-emitting element in which a compound semiconductor is stacked and a method of manufacturing the same, a conductive translucent electrode for a compound semiconductor light-emitting element used in the compound semiconductor light-emitting element, a lamp including the compound semiconductor light-emitting element, an electronic device including the lamp, and a mechanical apparatus including the electronic device.

The present invention claims the benefits of priorities of Japanese Patent Application Nos. 2008-014232, 2008-068076, and 2008-273092 filed in Jan. 24, 2008, Mar. 17, 2008, and Oct. 23, 2008, respectively, the entire contents of which are incorporated herein by reference.

BACKGROUND ART

In the related art, as an example of a compound semiconductor light-emitting element, a p-n junction light emitting diode (LED) is known. For example, a GaP-based LED or the like is known in the art, in which a GaP layer obtained by epitaxially growing a conductive gallium phosphide (GaP) single crystal on a substrate is used as a light-emitting layer. In addition, there are also known LEDs having red, orange-yellow, to green color ranges having a light-emitting layer including a mixed crystal of aluminum.gallium arsenide (having a composition of $Al_XGa_YAs$: $0 \leq X,Y \leq 1$, and $X+Y=1$) or a mixed crystal of aluminum.gallium.indium phosphide (having a composition of $Al_XGa_YIn_ZP$: $0 \leq X,Y,Z \leq 1$, and $X+Y+Z=1$). In addition, there are known short-wavelength LEDs having a near-ultraviolet, blue, or green color range using a gallium nitride-based compound semiconductor layer such as gallium-indium nitride (having a composition of $Ga_\alpha In_\beta N$: $0 \leq \alpha, \beta \leq 1$, $\alpha+\beta=1$) as the light-emitting layer.

For example, in the $Al_XGa_YIn_ZP$-based LED described above, a conductive n-type or p-type light-emitting layer is formed on a conductive p-type or n-type gallium arsenide (GaAs) single crystal substrate. In addition, in the blue color LED, single crystals such as sapphire ($\alpha$-$Al_2O_3$ single crystal) having an electric insulation are used in the substrate. In addition, in the short-wavelength LEDs, silicon carbide (SiC) having a cubical crystal structure (3C crystal type) or a hexagonal crystal structure (4H or 6H crystal type) is also used in the substrate. In addition, the light-emitting element is formed by providing, for example, a first conductive translucent electrode and a second conductive electrode in a predetermined position on the semiconductor wafer obtained by stacking the semiconductor layer on such a substrate.

Here, particularly, in the case of the gallium nitride-based compound semiconductor light-emitting element, a gallium nitride-based compound semiconductor is formed on a substrate containing various oxides or III-V group compounds as well as sapphire single crystals using a metal-organic chemical vapor deposition (MOCVD) method, a molecular beam epitaxial (MBE) method, or the like.

In the related art, as a characteristic of the gallium nitride-based compound semiconductor light-emitting element, an electric current diffusion to the horizontal direction is small, and the electric current is applied to only the semiconductor layer immediately underlying the electrode. Therefore, the light emitted from the light-emitting layer is blocked by the electrode, and it is difficult to extract the light to the outside. In this regard, such a gallium nitride-based compound semiconductor light-emitting element is typically configured such that a translucent electrode is used as the positive electrode, and the light is extracted from the positive electrode.

As the translucent electrode, for example, an Ni/Au stack structure or a conductive material known in the art such as ITO is used. In addition, recently, it has been proposed to use an oxide-based translucent electrode containing $In_2O_3$ or ZnO as a main component because they have a superior translucency (e.g., refer to Patent Citation 1). The ITO used in the light-emitting element disclosed in the Patent Citation 1 is most widely used as the translucent electrode. Such an ITO contains $In_2O_3$ where $SnO_2$ of 5 to 20 mass % is doped and can be obtained as a conductive oxide film having a low resistivity less than or equal to $2 \times 10^{-4}$ $\Omega$cm.

In order to improve light extraction efficiency from the translucent electrode, it has been proposed to emboss the light extraction surface of the translucent electrode (e.g., refer to Patent Citation 2). In the translucent electrode provided in the light-emitting element disclosed in Patent Citation 2, microcrystals are formed immediately after the ITO film having a low resistance is formed. Therefore, in order to emboss the ITO, it is necessary to use an etching solution such as an aqueous solution of ferric chloride ($FeCl_3$) or a hydrochloric acid (HCL). However, since the etching rate is fast in a wet etching process using such a strong acidic etching solution, it is difficult to control, and burrs are easily generated in the edge portions of the ITO film. In addition, since the overetching is easily generated, a product yield may be degraded.

In order to address the problem in the embossing process of the translucent electrode as disclosed in Patent Citation 2, it has been proposed to relatively smoothly perform the etching process without a strong acidic solution such as the etching solution by forming an amorphous IZO film using a sputtering method (e.g., refer to Patent Citation 3). According to the method disclosed in Patent Citation 3, burrs are hardly generated, and etching is not excessively performed in comparison with the etching process using strong acid. In addition, it is possible to readily perform micro-machining for improving the light extraction efficiency.

However, since the amorphous IZO film is inferior from the viewpoint of translucency in comparison with the ITO film subjected to the heat treatment, the light extraction efficiency may be degraded, and the light-emitting light output of the light-emitting element may be reduced. In addition, since the amorphous IZO film has a high contact resistance against the p-type GaN layer, the driving voltage of the light-emitting element may increase. In addition, since it is amorphous, water-resistance properties or chemical resistance properties are degraded. A product yield in the manufacturing process after the IZO film is formed is degraded. Therefore, device reliability may be degraded.

Meanwhile, there has been proposed a light-emitting element obtained by providing the crystallized IZO film on the p-type semiconductor and used as the translucent electrode (e.g., refer to Patent Citation 4). In addition, Patent Citation 4 discloses that the sheet resistance decreases as the annealing temperature increases by annealing the amorphous IZO film at a temperature ranging from 300 to 600° C. under a nitrogen atmosphere not including oxygen (paragraph 0036, Patent Citation 4) and that it is recognized that the IZO film is crystallized because an X-ray peak representing $In_2O_3$ is mainly detected when the IZO film is annealed at a temperature greater than or equal to 600° C. (refer to paragraph 0038, Patent Citation 4). In addition, Patent Citation 4 discloses that a transmittance in the ultraviolet light range (having a wavelength of 350 to 420 nm) increases 20 to 30% when the IZO film is annealed at a temperature of 600° C. in comparison with the IZO film not subjected to the annealing process (refer to paragraph 0040, Patent Citation 4). In addition, in the light-emitting element having such an IZO film, a light-emission distribution on the light-emitting plane shows that the light is emitted from the entire surface of the positive electrode, the driving voltage Vf is 3.3 V, and the light-emitting light output Po is 15 mW (refer to paragraph 0047, Patent Citation 4).

A crystal structure of indium oxide ($In_2O_3$) can be classified into two different crystal systems, a cubical crystal system and a hexagonal crystal system. In the case of the cubical crystal system, the fact that a stable bixbyite crystal structure can be obtained under a pressure equal to or lower than a normal pressure is known in the art and disclosed in various documents. In addition, a liquid crystal display panel obtained by using a polycrystal indium tin oxide film having the aforementioned cubical bixbyite crystal structure has been proposed (e.g., refer to Patent Citation 5).

As described above, in order to improve the light-emitting property of the light-emitting element, it is necessary to further improve light extraction efficiency from the translucent electrode provided on the p-type semiconductor layer. However, in the configurations of the translucent electrode disclosed in Patent Citations 1 to 5, it was difficult to obtain sufficient translucency. It is desired to provide a compound semiconductor light-emitting element including a translucent electrode having higher translucency and excellent light-emitting property.

[Patent Citation 1] Japanese Unexamined Patent Application Publication No. 2005-123501
[Patent Citation 2] Japanese Unexamined Patent Application Publication No. 2000-196152
[Patent Citation 3] Japanese Unexamined Patent Application Publication No. 08-217578
[Patent Citation 4] Japanese Unexamined Patent Application Publication No. 2007-287845
[Patent Citation 5] Japanese Unexamined Patent Application Publication No. 2001-215523

DISCLOSURE OF INVENTION

Problems to be Solved by the Invention

The present invention has been made to address the aforementioned problems and provides a compound semiconductor light-emitting element having excellent light-emitting property and a method of manufacturing the same, a conductive translucent electrode for the compound semiconductor light-emitting element having excellent light extraction efficiency and high productivity.

In addition, the present invention provides a lamp including the aforementioned compound semiconductor light-emitting element with a high light-emitting property, an electronic device including the lamp, and a mechanical apparatus including the electronic device.

Means for Solving the Problems

The inventors made a intensive investigation into addressing the aforementioned problems, and as a consequence, completed the following invention.

That is, the present invention relates to the following matters.

[1] A compound semiconductor light-emitting element including:
a substrate on which an n-type semiconductor layer, a light-emitting layer and a p-type semiconductor layer that are made of a compound semiconductor are stacked in this order;
a positive electrode made of a conductive translucent electrode; and
a negative electrode made of a conductive electrode,
wherein the conductive translucent electrode of the positive electrode is a transparent conductive film including crystals composed of $In_2O_3$ having a hexagonal crystal structure.

[2] The compound semiconductor light-emitting element according to [1], wherein a carrier mobility in the transparent conductive film is greater than or equal to 30 $cm^2/V·sec$.

[3] The compound semiconductor light-emitting element according to [1] or [2], wherein a carrier concentration in the transparent conductive film is ranging from $1\times10^{20}$ to $5\times10^{21}$ $cm^{-3}$.

[4] The compound semiconductor light-emitting element according to any one of [1] to [3], wherein the transparent conductive film has a sheet resistance less than or equal to 50 $\Omega$/sq.

[5] The compound semiconductor light-emitting element according to any one of [1] to [4], wherein the transparent conductive film has a thickness of 35 nm to 10,000 nm (10 $\mu$m).

[6] The compound semiconductor light-emitting element according to any one of [1] to [5], wherein the transparent conductive film has a concavo-convex surface.

[7] The compound semiconductor light-emitting element according to [6], wherein a plurality of independent concavo portions are provided on a surface of the transparent conductive film.

[8] The compound semiconductor light-emitting element according to [7], wherein a total area of the concavo portions of the transparent conductive film is ranging from ¼ to ¾ of an area of the entire transparent conductive film.

[9] The compound semiconductor light-emitting element according to any one of [6] to [8], wherein a thickness of the transparent conductive film at the concavo portion of the transparent conductive film is less than or equal to ½ of a thickness of the transparent conductive film at a convex portion.

[10] The compound semiconductor light-emitting element according to any one of [1] to [9], wherein the transparent conductive film is any one of an IZO film, an ITO film, and an IGO film.

[11] The compound semiconductor light-emitting element according to any one of [1] to [10], wherein the transparent conductive film is an IZO film, and a content of ZnO within the IZO film is ranging from 1 to 20 mass %.

[12] The compound semiconductor light-emitting element according to any one of [1] to [11], wherein the compound semiconductor is a gallium nitride-based compound semiconductor.

[13] The compound semiconductor light-emitting element according to any one of [1] to [12], wherein the positive electrode made of a conductive translucent electrode is provided on the p-type semiconductor layer, and the negative electrode made of the conductive electrode is provided on the n-type semiconductor layer.

[14] A method of manufacturing a compound semiconductor light-emitting element, including at least:

(a) a semiconductor layer forming process for manufacturing a semiconductor wafer by stacking an n-type semiconductor layer, a light-emitting layer, and a p-type semiconductor layer that are made of a compound semiconductor on a substrate in this order;

(b) a conductive translucent electrode stacking process for stacking an amorphous transparent conductive film on the p-type semiconductor layer;

(c) an etching process for etching the transparent conductive film in a predetermined shape; and (d) a heat treatment process in which a heat treatment is performed for the etched transparent conductive film while controlling a retention time within a temperature range of 300 to 800° C., thereby allowing the transparent conductive film to contain crystals composed of $In_2O_3$ having a hexagonal crystal structure and have a carrier mobility greater than or equal to 30 cm$^2$/V·sec in the film.

[15] The method of manufacturing the compound semiconductor light-emitting element according to [14], wherein the transparent conductive film is any one of an IZO film, an ITO film, and an IGO film.

[16] The method of manufacturing the compound semiconductor light-emitting element according to [14] or [15], wherein in the heat treatment process (d), the heat treatment is performed for the transparent conductive film while controlling the retention time within a temperature range of 300 to 800° C., thereby allowing the transparent conductive film to contain crystals composed of $In_2O_3$ having a hexagonal crystal structure and have a carrier mobility of 30 to 100 cm$^2$/V·sec in the film.

[17] The method of manufacturing the compound semiconductor light-emitting element according to any one of [14] to [16], wherein in the (b) conductive translucent electrode stacking process, the transparent conductive film is stacked using a sputtering method.

[18] The method of manufacturing the compound semiconductor light-emitting element according to any one of claims [14] to [17], wherein the compound semiconductor is a gallium nitride-based compound semiconductor.

[19] The method of manufacturing the compound semiconductor light-emitting element according to any one of claims [14] to [18], wherein the transparent conductive film is stacked on the p-type semiconductor layer.

[20] A compound semiconductor light-emitting element manufactured using the method of manufacturing the compound semiconductor light-emitting element according to any one of [14] to [19].

[21] A conductive translucent electrode for a compound semiconductor light-emitting element, including at least one transparent conductive film containing crystals composed of $In_2O_3$ having a hexagonal crystal structure, wherein a carrier mobility in the film is greater than or equal to 30 cm$^2$/V·sec.

[22] The conductive translucent electrode for the compound semiconductor light-emitting element according to [21], wherein a carrier mobility in the film is 30 to 100 cm$^2$/V·sec.

[23] The conductive translucent electrode for the compound semiconductor light-emitting element according to [21] or [22], wherein a carrier concentration within the film is ranging from $1\times10^{20}$ to $5\times10^{21}$ cm$^{-3}$.

[24] A lamp, having the compound semiconductor light-emitting element according to any one of [1] to [13] or [20].

[25] An electronic device, including the lamp according to [24].

[26] A mechanical apparatus, including the electronic device according to [25].

In addition, the present invention relates to the following matters.

[27] A compound semiconductor light-emitting element including:

an n-type semiconductor layer, a light-emitting layer, and a p-type semiconductor layer that are made of a compound semiconductor and stacked on a substrate in this order;

a positive electrode made of a conductive translucent electrode; and a negative electrode made of a conductive electrode, wherein the conductive translucent electrode of the positive electrode is made of a crystallized IZO film including crystals composed of $In_2O_3$ having a hexagonal crystal structure.

[28] The compound semiconductor light-emitting element according to [27], wherein a carrier mobility in the IZO film is greater than or equal to 30 cm$^2$/V·sec.

[29] The compound semiconductor light-emitting element according to [28], wherein a carrier mobility in the IZO film is greater than or equal to 35 cm$^2$/V·sec.

[30] The compound semiconductor light-emitting element according to [28], wherein a carrier mobility in the IZO film is greater than or equal to 38 cm$^2$/V·sec.

[31] The compound semiconductor light-emitting element according to [28], wherein a carrier mobility in the IZO film is 30 to 100 cm$^2$/V·sec.

[32] The compound semiconductor light-emitting element according to [29], wherein a carrier mobility in the IZO film is 35 to 90 cm$^2$/V·sec.

[33] The compound semiconductor light-emitting element according to any one of [27] to [32], wherein a carrier concentration in the IZO film is $1\times10^{20}$ to $5\times10^{21}$ cm$^{-3}$.

[34] The compound semiconductor light-emitting element according to any one of [27] to [33], wherein the IZO film has a sheet resistance less than or equal to 50 Ω/sq.

[35] The compound semiconductor light-emitting element according to any one of [27] to [34], wherein a content of ZnO within the IZO film is ranging from 1 to 20 mass %.

[36] The compound semiconductor light-emitting element according to any one of [27] to [35], wherein the IZO film has a thickness of 35 nm to 10,000 nm (10 μm).

[37] The compound semiconductor light-emitting element according to any one of [27] to [36], wherein the IZO film has a concavo-convex surface.

[38] The compound semiconductor light-emitting element according to [37], wherein a plurality of independent concavo portions are provided on a surface of the IZO film.

[39] The compound semiconductor light-emitting element according to [38], wherein a total area of the concavo portions of the IZO film is ranging from ¼ to ¾ of an area of the entire IZO film.

[40] The compound semiconductor light-emitting element according to any one of [37] to [39], wherein a thickness of the IZO film at the concavo portion of the IZO film is less than or equal to ½ of a thickness of the IZO film at a convex portion.

[41] The compound semiconductor light-emitting element according to any one of [27] to [40], wherein the compound semiconductor is a gallium nitride-based compound semiconductor.

[42] The compound semiconductor light-emitting element according to any one of [27] to [41], wherein a positive electrode made of a conductive translucent electrode is provided on the p-type semiconductor layer, and the negative electrode made of a conductive electrode is provided on the n-type semiconductor layer.

[43] A method of manufacturing a compound semiconductor light-emitting element, the method including at least:

(a) a semiconductor layer forming process for manufacturing a semiconductor wafer by stacking an n-type semiconductor layer, a light-emitting layer, and a p-type semiconductor layer that are made of a compound semiconductor on a substrate in this order;

(b) a conductive translucent electrode stacking process for stacking an amorphous IZO film on the p-type semiconductor layer;

(c) an etching process for etching the IZO film in a predetermined shape; and (d) a heat treatment process in which a heat treatment is performed for the etched IZO film while controlling a retention time within a temperature range of 500 to 800° C., thereby allowing the IZO film to contain crystals composed of $In_2O_3$ having a hexagonal crystal structure and have a carrier mobility greater than or equal to 30 $cm^2/V\cdot sec$ in the film.

[44] The method of manufacturing the compound semiconductor light-emitting element according to [43], wherein in the heat treatment process (d), the heat treatment is performed for the IZO film while controlling the retention time within a temperature range of 500 to 800° C., thereby allowing the IZO film to contain crystals composed of $In_2O_3$ having a hexagonal crystal structure, and a carrier mobility of 30 to 100 $cm^2/V\cdot sec$ in the film.

[45] The method of manufacturing the compound semiconductor light-emitting element according to any one of [43] or [44], wherein in the (b) conductive translucent electrode stacking process, the IZO film is stacked using a sputtering method.

[46] The method of manufacturing the compound semiconductor light-emitting element according to any one of claims [43] to [45], wherein the compound semiconductor is a gallium nitride-based compound semiconductor.

[47] The method of manufacturing the compound semiconductor light-emitting element according to any one of claims [43] to [46], wherein the IZO film is stacked on the p-type semiconductor layer.

[48] A compound semiconductor light-emitting element manufactured using the method of manufacturing the compound semiconductor light-emitting element according to any one of [43] to [47].

[49] A conductive translucent electrode for a compound semiconductor light-emitting element, including at least one IZO film containing crystals composed of $In_2O_3$ having a hexagonal crystal structure, wherein a carrier mobility in the film is greater than or equal to 30 $cm^2/V\cdot sec$.

[50] The conductive translucent electrode for the compound semiconductor light-emitting element according to [48], wherein a carrier mobility in the film is 30 to 100 $cm^2/V\cdot sec$.

[51] The conductive translucent electrode for the compound semiconductor light-emitting element according to [49] or [50], wherein a carrier concentration within the film is ranging from $1\times10^{20}$ to $5\times10^{21}$ $cm^{-3}$.

[52] A lamp, having the compound semiconductor light-emitting element according to any one of [27] to [42] or [48].

[53] An electronic device, including the lamp according to [52].

[54] A mechanical apparatus, including the electronic device according to [53].

EFFECTS OF THE INVENTION

In the compound semiconductor light-emitting element according to the present invention, each layer made of a compound semiconductor is stacked on the substrate, and the positive electrode made of the conductive translucent electrode and the negative electrode made of conductive electrode are included, wherein the conductive translucent electrode of the positive electrode is a transparent conductive film containing crystals composed of $In_2O_3$ having a hexagonal crystal structure. Therefore, it is possible to provide a conductive translucent electrode having a high optical transmittance, particularly, from the visible light range to the ultraviolet light range and increase the light extraction property of the light-emitting element. As a result, it is possible to implement the compound semiconductor light-emitting element having highly excellent light-emitting light output properties.

Furthermore, since a carrier mobility of the transparent conductive film of the conductive translucent electrode is controlled to be greater than or equal to 30 $cm^2/V\cdot sec$, it is possible to provide a positive electrode having a low resistance and implement a compound semiconductor light-emitting element having low driving voltage.

In the compound semiconductor light-emitting element according to the present invention, each layer made of a compound semiconductor is stacked on the substrate, and the positive electrode made of the conductive translucent electrode and the negative electrode made of conductive electrode are included, wherein the conductive translucent electrode of the positive electrode is a crystallized IZO film containing crystals composed of $In_2O_3$ having a hexagonal crystal structure. Therefore, it is possible to provide a conductive translucent electrode having a high optical transmittance, particularly, from the visible light range to the ultraviolet light range and increase the light extraction property of the light-emitting element. As a result, it is possible to implement the compound semiconductor light-emitting element having highly excellent light-emitting output properties.

Furthermore, since a carrier mobility of the IZO film of the conductive translucent electrode is controlled to be greater than or equal to 30 $cm^2/V\cdot sec$, it is possible to provide a positive electrode having a low resistance and implement a compound semiconductor light-emitting element having low driving voltage.

The method of manufacturing the compound semiconductor light-emitting element according to the present invention includes: a semiconductor layer forming process for manufacturing a semiconductor wafer by stacking each of layers made of a compound semiconductor on a substrate; a conductive translucent electrode stacking process for stacking an amorphous transparent conductive film on the p-type semiconductor layer; an etching process for etching the transparent conductive film in a predetermined shape; and a heat treatment process in which a heat treatment is performed for the transparent conductive film while controlling a retention time within a temperature range of 300 to 800° C., thereby allowing the transparent conductive film to contain crystals composed of $In_2O_3$ having a hexagonal crystal structure and have a carrier mobility greater than or equal to 30 $cm^2/V\cdot sec$ in the film. As a result, it is possible to provide a conductive translucent electrode having a high optical transmittance, particularly, from the visible light range to the ultraviolet light range. It is possible to obtain the compound semiconductor light-emitting element having highly excellent light-emitting output properties and a low driving voltage.

The method of manufacturing the compound semiconductor light-emitting element according to the present invention includes: a semiconductor layer forming process for manufacturing a semiconductor wafer by stacking each of layers made of a compound semiconductor on a substrate; a conductive translucent electrode stacking process for stacking an amorphous IZO film on the p-type semiconductor layer; an etching process for etching the IZO film in a predetermined shape; and a heat treatment process in which a heat treatment is performed for the IZO film while controlling a retention time within a temperature range of 500 to 800° C., thereby allowing the IZO film to contain crystals composed of $In_2O_3$ having a hexagonal crystal structure and have a carrier mobility greater than or equal to 30 $cm^2/V·sec$ in the film. As a result, it is possible to provide a conductive translucent electrode having a high optical transmittance, particularly, from the visible light range to the ultraviolet light range. It is possible to obtain the compound semiconductor light-emitting element having highly excellent light-emitting output properties and a low driving voltage.

The translucent electrode for the compound semiconductor light-emitting element according to the present invention is made of a transparent conductive film containing crystals composed of $In_2O_3$ having a hexagonal crystal structure, and a carrier mobility in the film is greater than or equal to 30 $cm^2/V·sec$. As a result, it is possible to obtain an electrode having a low resistance and excellent translucency.

The translucent electrode for the compound semiconductor light-emitting element according to the present invention is made of an IZO film containing crystals composed of $In_2O_3$ having a hexagonal crystal structure, and a carrier mobility in the film is greater than or equal to 30 $cm^2/V·sec$. As a result, it is possible to obtain an electrode having a low resistance and excellent translucency.

The lamp according to the present invention includes a semiconductor compound light-emitting element of the present invention. As a result, it is possible to provide excellent light-emitting output properties.

The electronic device according to the present invention includes the lamp of the present invention. Therefore, it is possible to provide a device with excellent properties. In addition, the mechanical apparatus according to the present invention includes the electronic device according to the present invention. Therefore, it is possible to provide a device with excellent properties.

The reference symbol shown in these figures are defined as follows:

1 . . . compound semiconductor light-emitting element (light-emitting element, gallium nitride-based compound semiconductor light-emitting element),
10, 20 . . . semiconductor wafer,
11, 21 . . . substrate,
12 . . . n-type semiconductor layer,
13 . . . light-emitting layer,
14 . . . p-type semiconductor layer,
15 . . . positive electrode (conductive translucent electrode: IZO film),
16 . . . positive electrode bonding pad,
17 . . . negative electrode,
22 . . . GaN base layer (n-type semiconductor layer),
23 . . . n-type GaN contact layer (n-type semiconductor layer),
24 . . . n-type AlGaN clad layer (n-type semiconductor layer),
25 . . . light-emitting layer,
26 . . . p-type AlGaN clad layer (p-type semiconductor layer),
27 . . . p-type GaN contact layer (p-type semiconductor layer),
30 . . . lamp

BEST MODE FOR CARRYING OUT THE INVENTION

Figure 1:
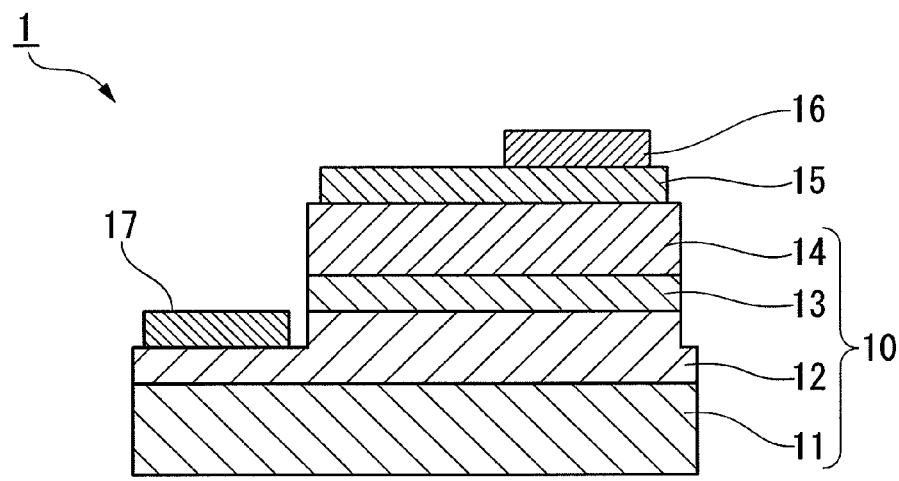
FIG. 1 schematically illustrates an example of a compound semiconductor light-emitting element according to the present invention and is a schematic diagram illustrating a cross-sectional structure.
Figure 2:
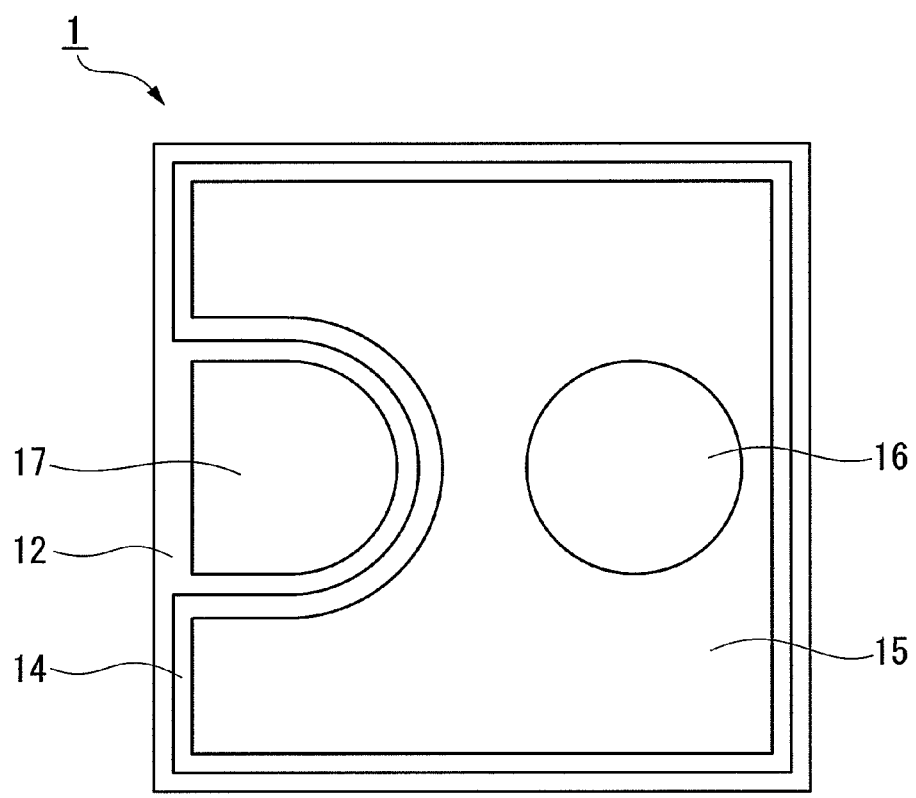
FIG. 2 schematically illustrates an example of a compound semiconductor light-emitting element according to the present invention and is a schematic diagram illustrating a plan structure.
Figure 3:
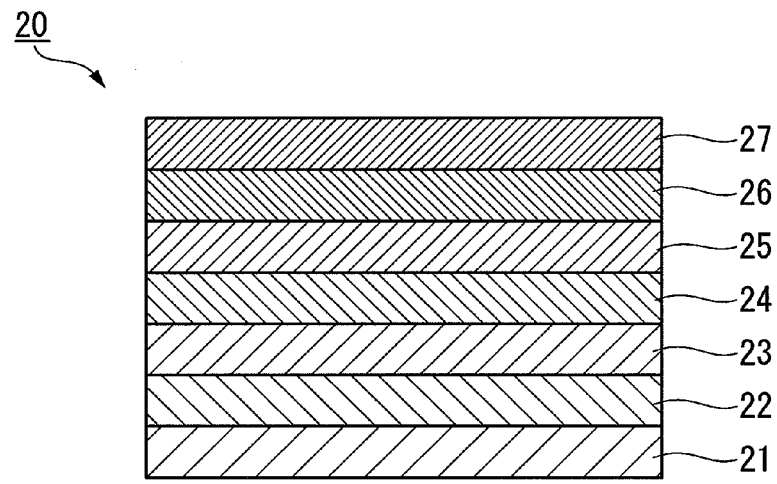
FIG. 3 is a cross-sectional diagram schematically illustrating an example of a semiconductor wafer used in the compound semiconductor light-emitting element according to the present invention.
Figure 4:
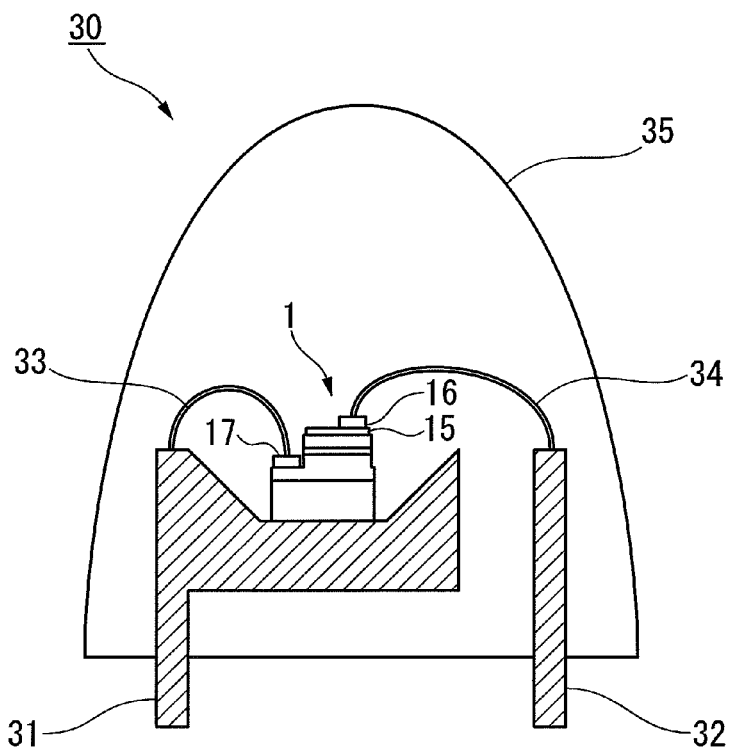
FIG. 4 is a schematic diagram illustrating a lamp configured using the compound semiconductor light-emitting element according to the present invention.
Figure 5A:
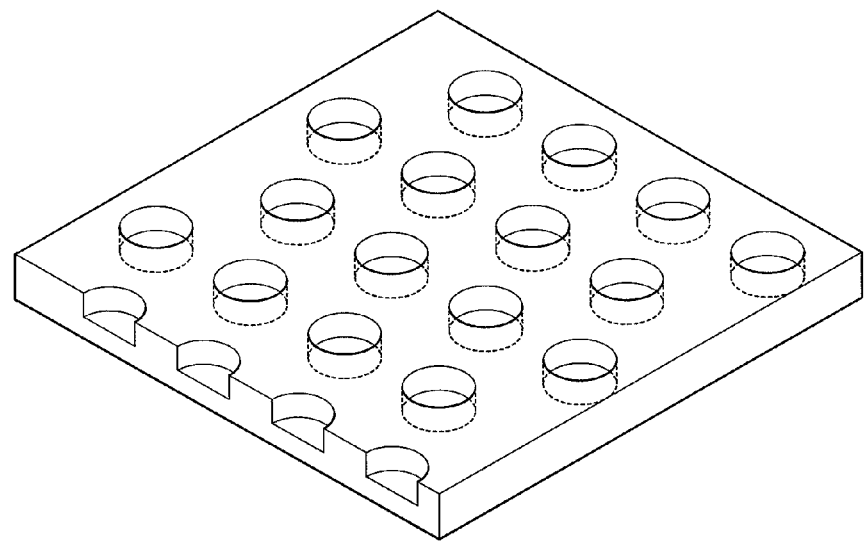
FIG. 5A schematically illustrates another example of a compound semiconductor light-emitting element according to the present invention and is a schematic diagram illustrating an example in which a concavo-convex shape is formed on a surface of an IZO film included in the positive electrode.
Figure 5B:
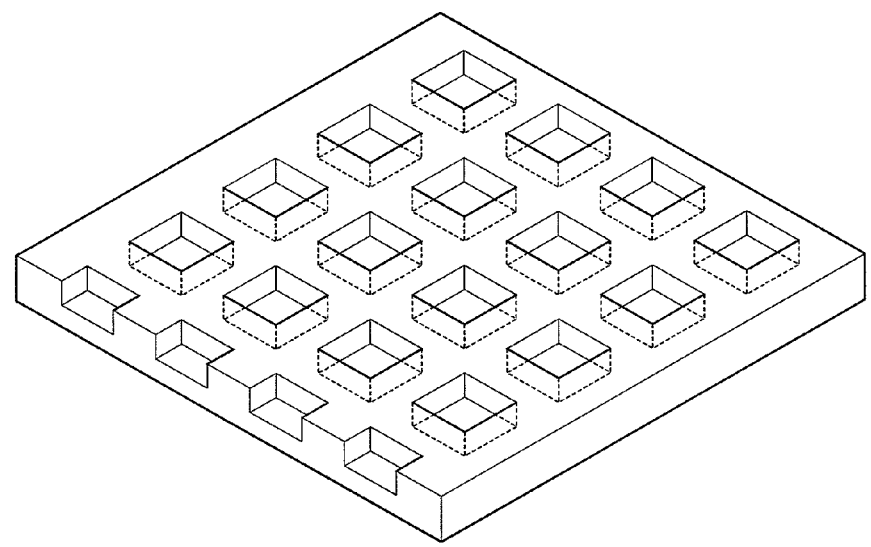
FIG. 5B schematically illustrates another example of a compound semiconductor light-emitting element according to the present invention and is a schematic diagram illustrating an example in which a concavo-convex shape is formed on a surface of an IZO film included in the positive electrode.
Figure 6:
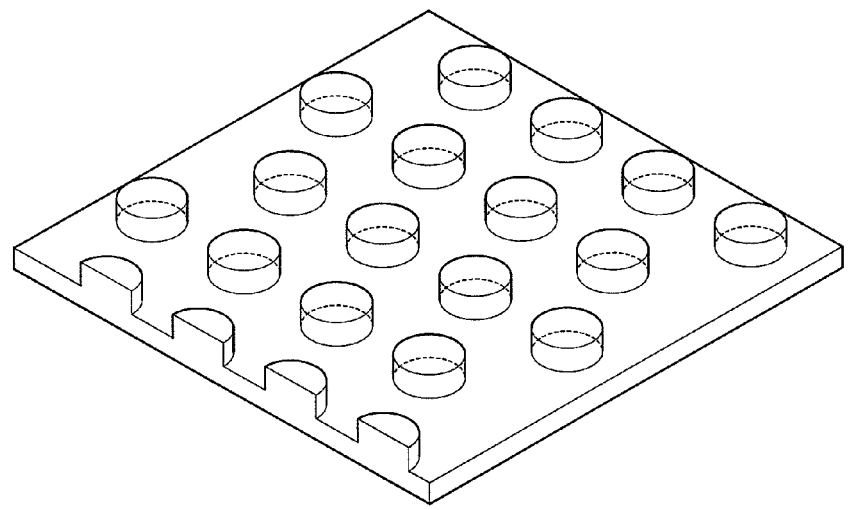
FIG. 6 schematically illustrates another example of a compound semiconductor light-emitting element according to the present invention and is a schematic diagram illustrating an example in which a concavo-convex shape is formed on a surface of an IZO film included in the positive electrode.

Hereinafter, a compound semiconductor light-emitting element and a method of manufacturing the same, a conductive translucent electrode for the compound semiconductor light-emitting element, a lamp, an electronic device, and a mechanical apparatus according to embodiments of the present invention will be appropriately described with reference to FIGS. 1 to 6 (and FIGS. 7 to 21). FIG. 1 is a cross-sectional diagram illustrating a face-up type compound semiconductor light-emitting element according to an embodiment of the present invention. FIG. 2 is a top plan view illustrating the compound semiconductor light-emitting element of FIG. 1. FIG. 3 is a cross-sectional diagram illustrating an example of a gallium nitride-based compound semiconductor layer having a stack structure. FIG. 4 is a schematic diagram illustrating a lamp used in the compound semiconductor light-emitting element of FIG. 1. FIGS. 5A, 5B, and 6 are schematic diagrams illustrating an example where the positive electrode of the compound semiconductor light-emitting element has a concavo-convex surface. In addition, the drawings referenced in the following descriptions are provided to describe a compound semiconductor light-emitting element and a method of manufacturing the same, a conductive translucent electrode for the compound semiconductor light-emitting element, a lamp, an electronic device, and a mechanical apparatus according to an embodiment of the present invention, in which magnitudes, thicknesses, or dimensions of each illustrated component are different from the dimensional relationships of an actual compound semiconductor light-emitting element or the like.

For example, a compound semiconductor included in the light-emitting element according to the present invention may include a group-III nitride semiconductor based light-emitting element expressed by a general formula $Al_XGa_YIn_ZN1-aMa$ (where, $0 \leq X \leq 1$, $0 \leq Y \leq 1$, $0 \leq Z \leq 1$, $X+Y+Z=1$, the symbol M denotes a group-V element different from nitrogen, and $0 \leq a < 1$), provided on a sapphire substrate, a silicon carbide or silicon substrate, or the like. Alternatively, an $Al_XGa_YAs$ (where, $0 \leq X, Y \leq 1$, and $X+Y=1$) based light-emitting element or an $Al_XGa_YIn_ZP$ (where, $0 \leq X, Y, Z \leq 1$, and $X+Y+Z=1$) based light-emitting element provided on a gallium arsenide (GaAs) based single crystal substrate may be used. Alternatively, a GaP based light-emitting element provided on the GaP substrate may be used. In addition, according to an embodiment of the present invention, a configuration of a compound semiconductor included in any other light-emitting element known in the art may be used. Particularly, it is preferable that a gallium nitride-based compound semiconductor light-emitting element is used as an example of the group-III nitride semiconductor.

The compound semiconductor layer used in the light-emitting element described above is stacked on the substrate selected based on an objective function. For example, in order to configure a light-emitting layer having a double heterojunction structure, the n-type semiconductor layer and the p-type semiconductor layer are provided on first and second main surfaces, i.e., both surfaces of the light-emitting layer. In addition, in order to supply a driving current, an electrode is provided on each of the n-type semiconductor layer and the p-type semiconductor layer. As such an electrode, a conductive translucent electrode having a high translucency, particularly, in the light output side is used. According to an embodiment of the present invention, the conductive translucent electrode used in the light output side is made of a transparent conductive film containing crystals composed of $In_2O_3$ having a hexagonal crystal structure. For example, according to the present invention, the conductive translucent electrode used in the light output side may be made of a crystallized IZO film and contain crystals composed of $In_2O_3$ having a hexagonal crystal structure.

The present invention is not limited to the gallium nitride-based compound semiconductor light-emitting element, but may be applied to the light-emitting elements using various compound semiconductors as described above.

Compound Semiconductor Light-emitting Element

The compound semiconductor light-emitting element 1 (hereinafter, also referred to as a light-emitting element) of the present embodiment includes the n-type semiconductor layer 12, the light-emitting layer 13, and the p-type semiconductor layer 14 that are made of a compound semiconductor (hereinafter, also referred to as a semiconductor) and stacked on the substrate 11 in this order and further includes the positive electrode 15 made of a conductive translucent electrode and the negative electrode made of a conductive electrode 17 as described in the example of FIG. 1. The conductive translucent electrode included in the positive electrode 15 is made of a transparent conductive film containing crystals composed of $In_2O_3$ having a hexagonal crystal structure. For example, the conductive translucent electrode included in the positive electrode 15 may be made of a crystallized IZO film, the IZO film may contain crystals composed of $In_2O_3$ having a hexagonal crystal structure.

In addition, the light-emitting element 1 shown in the drawing has a positive electrode bonding pad 16 as a material of the conductive electrode on the positive electrode 15 made of a conductive translucent electrode.

Hereinafter, the stack structure of the light-emitting element 1 according to an embodiment of the present invention will be described.

Substrate

A material of the substrate 11 may include a substrate material known in the art, including oxide single crystals such as a sapphire single crystal ($Al_2O_3$; A-plane, C-plane, M-plane, R-plane), a spinel single crystal ($MgAl_2O_4$), a ZnO single crystal, a $LiAlO_2$ single crystal, a $LiGaO_2$ single crystal, and a MgO single crystal, or a Si single crystal, a SiC single crystal, a GaAs single crystal, an AlN single crystal, a GaN single crystal, or a boride single crystal such as $ZrB_2$ without any limitation.

In addition, the plane-orientation of the substrate is not particularly limited. Furthermore, either a flat substrate or an offset substrate may be used.

Semiconductor Layer (Compound Semiconductor: Gallium Nitride-based Compound Semiconductor)

Various structures of the n-type semiconductor layer 12, the light-emitting layer 13, and the p-type semiconductor layer 14 are well known in the art, and any of them may be used without any limitation. Particularly, a p-type semiconductor layer 14 having a typical carrier concentration may be used. A p-type semiconductor layer having a relatively low carrier concentration, e.g., $1 \times 10^{17}$ cm$^{-3}$ may also be used in the present invention, and a positive electrode 15 made of a transparent conductive film which will be described below in detail may be used.

For example, the compound semiconductor used in each of the semiconductor layers may include a gallium nitride-based compound semiconductor. As an example of the gallium nitride-based compound semiconductor, various semiconductors having a composition expressed by a general formula $Al_xIn_yGa_{1-x-y}N$ (where, $0 \leq x < 1$, $0 \leq y < 1$, and $0 \leq x+y < 1$) are well known in the art. As the gallium nitride-based compound semiconductor included in the n-type semiconductor layer, the light-emitting layer, and the p-type semiconductor layer according to the present invention, various semiconductors having a composition expressed by a general formula $Al_xIn_yGa_{1-x-y}N$ (where, $0 \leq x < 1$, $0 \leq y < 1$, and $0 \leq x+y < 1$) may be used without any limitation.

As an example of the semiconductor wafer obtained by stacking the gallium nitride-based compound semiconductor described above on the substrate, the gallium nitride-based compound semiconductor wafer 20 having a stack structure shown in FIG. 3 may obtained by a buffer layer (not shown) made of AlN being stacked on the substrate 21 made of sapphire and then sequentially stacking a GaN base layer 22, an n-type GaN contact layer 23, an n-type AlGaN clad layer 24, a light-emitting layer 25 made of InGaN, a p-type AlGaN clad layer 26, and a p-type GaN contact layer 27.

Positive Electrode (Conductive Translucent Positive Electrode: Transparent Conductive Film)

A positive electrode 15 made of a conductive translucent electrode is stacked on the p-type semiconductor layer 14 provided on top of the semiconductor layer described above. The conductive translucent electrode included in the positive electrode 15 of the present embodiment includes a transparent conductive film containing crystals composed of $In_2O_3$ having a hexagonal crystal structure.

Preferably, the transparent conductive film includes any one of an IZO (indium zinc oxide) film, an ITO (indium titanium oxide) film, and an IGO (indium-gallium oxide) film.

For example, the conductive translucent electrode included in the positive electrode 15 of the present embodiment may be made of a crystallized IZO (indium zinc oxide) film, and the IZO film may contain crystals composed of $In_2O_3$ having a hexagonal crystal structure.

Particularly, according to the present invention, a mobility of the carrier of the transparent conductive film used in the positive electrode 15, e.g., the IZO film is preferably greater than or equal to 30 cm$^2$/V·sec. In addition, the mobility of the carrier is, more preferably, greater than or equal to 35 cm$^2$/V·sec and most preferably, greater than or equal to 38 cm$^2$/V·sec. Furthermore, a mobility of the carrier within the transparent conductive film is preferably ranging from 30 to 100 cm$^2$/V·sec, more preferably, from 35 to 90 cm$^2$/V·sec, and most preferably, from 38 to 90 cm$^2$/V·sec.

By controlling the carrier mobility in the film of the positive electrode (conductive translucent electrode) 15 into the aforementioned range, it is possible to obtain a positive electrode having a high optical transmittance, particularly, from a visible light range to an ultraviolet light range. Furthermore, it is possible to improve the light-emitting output properties of the light-emitting element 1.

In addition, the mobility described in the present invention refers to an amount obtained by dividing a movement velocity by the intensity of the electric field when electrically-charged particles, i.e., carriers are moved under an electric field.

In addition, according to the present invention, the carrier concentration of the transparent conductive film such as an IZO film included in the positive electrode 15 is not particularly limited, but is preferably ranging from $1 \times 10^{20}$ to $5 \times 10^{21}$ cm$^{-3}$, and more preferably, from $1 \times 10^{20}$ to $1 \times 10^{21}$ cm$^{-3}$.

Furthermore, according to the present invention, the sheet resistance of the transparent conductive film included in the positive electrode 15 is preferably less than or equal to 50 Ω/sq, and more preferably, less than or equal to 20 Ω/sq in order to effectively diffuse an electric current.

As the transparent conductive film, e.g., the IZO film, included in the positive electrode 15, a material having a lowest specific resistance is preferably used. For example, when the transparent conductive film is made of the IZO film, the concentration of ZnO within the IZO film is preferably 1 to 20 mass %, more preferably, 5 to 15 mass %, and most preferably, 10 mass %.

As the crystal composed of $In_2O_3$, a hexagonal crystal structure and a cubical crystal structure having a bixbyite structure are known in the art. According to the present invention, the transparent conductive film used as the positive electrode 15 may include $In_2O_3$ having a cubical crystal structure as well as the hexagonal crystal structure. According to the present invention, the IZO film used as the positive electrode 15 may also include $In_2O_3$ having a cubical crystal structure or the hexagonal crystal structure.

In addition, according to the present invention, in the transparent conductive film, e.g., the IZO film, used as the positive electrode 15, an $In_2O_3$ crystal mainly having a hexagonal crystal structure is included by performing a heat treatment for an amorphous transparent conductive film as a compound oxide between $In_2O_3$ and an oxidation metal included in the transparent conductive film while controlling a retention time within a temperature range of 500 to 800° C., thereby making it possible to obtain a transparent conductive film having a high crystallinity in which a mobility of the carrier within the film is greater than or equal to 30 $cm^2/V \cdot sec$.

The inventors' experiments showed that the composition of the amorphous transparent conductive film, e.g., the IZO film, can be controlled to contain a larger number of $In_2O_3$ crystals generally having a hexagonal crystal structure by optimizing conditions (such as a temperature or a retention time) in the heat treatment process which will be described below, and the light-emitting characteristic of the light-emitting element can be significantly improved by using such a transparent conductive film in the positive electrode (the conductive translucent electrode) of the compound semiconductor light-emitting element (refer to the manufacturing method and the examples which will be described below).

Meanwhile, according to the inventors' experiments, it was obvious that, when the heating condition is not adequate, the transparent conductive film (e.g., the IZO film) described above experiences transition from the hexagonal crystal structure to the bixbyite (cubical crystal) structure, thereby causing the sheet resistance to be increased as a result thereof, and the characteristic of the conductive translucent electrode for the compound semiconductor light-emitting element to be degraded. In addition, it was also obvious that, when the transparent conductive film is made of the IZO film, the composition of the IZO film becomes irregular due to migration(movement) of Zn depending on the heat treatment condition.

The positive electrode provided in the compound semiconductor light-emitting element according to the present invention has the aforementioned configuration and becomes a conductive translucent electrode having excellent optical transmittance by appropriately controlling the condition of the heat treatment process which will be described below in detail.

In addition, the thickness of the transparent conductive film such as an IZO film included in the positive electrode 15 is preferably ranging from 35 nm to 10,000 nm (10 μm) to obtain a low sheet resistance and a high light transmittance. Furthermore, from the viewpoint of the manufacturing cost, the thickness of the positive electrode 15 is preferably less than or equal to 1,000 nm (1 μm).

In addition, the surface of the transparent conductive film, e.g., the IZO film, included in the positive electrode 15 is preferably concavo-convex as shown in FIGS. 5A, 5B, and 6 according to the method described below. While such embossing process will be described in detail, it is possible to improve the optical transmittance of the positive electrode and the light-emitting output of the light emitting element by embossing the surface of the transparent conductive film.

The positive electrode 15 formed of the transparent conductive film, e.g., the IZO film, is provided immediately on the p-type semiconductor layer 14 or on the p-type semiconductor layer 14 by interposing a metal layer (not shown). Here, when the metal layer is interposed between the positive electrode 15 and the p-type semiconductor layer 14, it is possible to reduce the driving voltage of the light-emitting element. However, the optical transmittance of the positive electrode and light-emitting output of the light-emitting element may be reduced. Therefore, it is preferable to take a balance between the driving voltage and the output into consideration according to the use of the light-emitting element or the like to determine whether or not to have a configuration in which the metal layer is interposed between the positive electrode and the p-type semiconductor layer. In addition, when the metal layer is interposed between the positive electrode and the p-type semiconductor layer, the metal layer preferably includes Ni or Ni oxide, Pt, Pd, Ru, Rh, Re, Os, or the like.

The positive electrode included in the compound semiconductor light-emitting element according to the present invention, i.e., the conductive translucent electrode for the compound semiconductor light-emitting element can obtain excellent translucency and a light extraction property using the aforementioned configuration.

Negative Electrode

After performing the heat treatment for the transparent conductive film such as an IZO film included in the positive electrode 15 (refer to the heat treatment process which will be described below), the p-type semiconductor layer 14, the light-emitting layer 13, and the n-type semiconductor layer 12 are partially removed by etching as shown in FIGS. 1 and 2 to expose a part of the n-type semiconductor layer 12. On the exposed n-type semiconductor layer 12, a negative electrode 17 made of, for example, Ti/Au is provided as known in the art. Negative electrodes having various compositions and structures are known in the art as the negative electrode 17, these negative electrodes known in the art may be used without any limitation.

Positive Electrode Bonding Pad

On at least a part of the transparent conductive film, e.g., the IZO film included in the positive electrode (conductive translucent electrode) 15, a positive electrode bonding pad 16 for electrical connection to a lead frame or a circuit board external to the light-emitting element is provided. Various structures and materials such as Au, Al, Ni, and Cu are known in the art as the positive electrode bonding pad 16, and these materials and structures known in the art may be used without any limitation.

The thickness of the positive electrode bonding pad 16 is preferably ranging from 100 to 1,000 nm. Since a bondability of the bonding pad increases as the thickness increases, the thickness of the positive electrode bonding pad 16 is preferably greater than or equal to 300 nm. Furthermore, from the viewpoint of the manufacturing cost, the thickness of the positive electrode bonding pad 16 is preferably less than or equal to 500 nm.

Protection Layer

According to the present embodiment, in order to prevent oxidation of the positive electrode 15 made of the transparent conductive film such as an IZO film, a protection layer (not shown) is preferably provided on the positive electrode 15. Such a protection layer is preferably made of a material having excellent translucency to cover the entire area of the positive electrode 15 except for the area of the positive electrode bonding pad 16. In addition, the protection layer is preferably made of an insulation material in order to prevent leakage between the p-type semiconductor layer 14 and the n-type semiconductor layer 12, and, for example, $SiO_2$, $Al_2O_3$, or the like may be used. In addition, a thickness of the protection layer may be set to prevent oxidation of the positive electrode 15 made of the transparent conductive film, for example, IZO film and maintain the translucency. Specifically, for example, the thickness of the protection layer is preferably ranging from 20 nm to 500 nm.

In the compound semiconductor light-emitting element according to the present embodiment described above, each layer made of a compound semiconductor is stacked on the substrate 11, and furthermore, the positive electrode 15 made of a conductive translucent electrode and the negative electrode 17 made of the conductive electrode are provided. The conductive translucent electrode included in the positive electrode 15 is made of a transparent conductive film containing crystals composed of $In_2O_3$ having a hexagonal crystal structure. Therefore, it is possible to provide a conductive translucent electrode having a high optical transmittance, particularly, from the visible light range to the ultraviolet light range and improve the light extraction property of the light-emitting element 1.

In the compound semiconductor light-emitting element according to the present embodiment, each layer made of a compound semiconductor is stacked on the substrate 11, and furthermore, the positive electrode 15 made of a conductive translucent electrode and the negative electrode 17 made of a conductive electrode are provided. The conductive translucent electrode included in the positive electrode 15 is made of a crystallized IZO film, and the IZO film contains crystals composed of $In_2O_3$ having a hexagonal crystal structure. Therefore, it is possible to provide a conductive translucent electrode having excellent optical transmittance, particularly, from the visible light range to the ultraviolet light range and improve the light extraction property of the light-emitting element 1. As a result, it is possible to implement a compound semiconductor light-emitting element 1 having highly excellent light-emitting output properties. Furthermore, by controlling the carrier mobility in the transparent conductive film such as an IZO film, included in the positive electrode (conductive translucent electrode) 15 to be greater than or equal to 30 $cm^2/V \cdot sec$, it is possible to reduce the resistance of the positive electrode 15 and implement a compound semiconductor light-emitting element 1 with a lowered driving voltage.

In the positive electrode 15 (the translucent electrode for the compound semiconductor light-emitting element) used in the compound semiconductor light-emitting element 1 according to the present embodiment, the transparent conductive film contains crystals composed of $In_2O_3$ having a hexagonal crystal structure, and the carrier mobility in the film is greater than or equal to 30 $cm^2/V \cdot sec$. Therefore, it is possible to obtain excellent translucency and a low resistance.

In the positive electrode 15 (the translucent electrode for the compound semiconductor light-emitting element) used in the compound semiconductor light-emitting element 1 according to the present embodiment, the IZO film contains crystals composed of $In_2O_3$ having a hexagonal crystal structure, and the carrier mobility in the film is greater than or equal to 30 $cm^2/V \cdot sec$. Therefore, it is possible to obtain excellent translucency and a low resistance.

Method of Manufacturing Compound Semiconductor Light-emitting Element

In a method of manufacturing the compound semiconductor light-emitting element according to the present embodiment, the light-emitting element 1 illustrated in FIGS. 1 and 2 is manufactured through at least each of the following processes (a) to (d):

(a) A semiconductor layer forming process for manufacturing a semiconductor wafer 10 by stacking an n-type semiconductor layer 12, a light-emitting layer 13, and a p-type semiconductor layer 14 that are made of a compound semiconductor on a substrate 11 in this order;

(b) a conductive translucent electrode stacking process for stacking an amorphous transparent conductive film such as an IZO film, on the p-type semiconductor layer 14;

(c) an etching process for etching the transparent conductive film such as an IZO film, in a predetermined shape; and (d) a heat treatment process for obtaining a positive electrode 15 by performing a heat treatment for the etched transparent conductive film such as an IZO film, while controlling a retention time within a temperature range of 500 to 800° C., thereby allowing the transparent conductive film such as an IZO film to contain crystals composed of $In_2O_3$ having a hexagonal crystal structure and have a carrier mobility greater than or equal to 30 $cm^2/V \cdot sec$ in the film.

Semiconductor Layer Forming Process

In the manufacturing method of the present embodiment, first, the (a) semiconductor layer forming process is performed to provide a semiconductor wafer 10 by stacking the n-type semiconductor layer 12, the light-emitting layer 13, and the p-type semiconductor layer 14 that form a compound semiconductor in this order on the substrate 11.

Specifically, after forming the buffer layer (not shown) made of, for example, AN or the like on the substrate 11, the n-type semiconductor layer 12, the light-emitting layer 13, and the p-type semiconductor layer 14 are sequentially stacked to form the semiconductor layer by epitaxially growing a gallium nitride-based compound semiconductor on this buffer layer.

A method of growing the aforementioned gallium nitride-based compound semiconductor is not particularly limited, but may include any method known in the art to grow the gallium nitride-based compound semiconductor such as an MOCVD (metal organic chemical vapor deposition), a HVPE (hydride vapor phase epitaxy), and an MBE (molecular beam epitaxy). The MOCVD may be preferably used from the viewpoint of controllability of the film thickness and productivity. In the MOCVD, hydrogen ($H_2$) or nitrogen ($N_2$) is used as the carrier gas. Tri-methyl gallium (TMG) or tri-ethyl gallium (TEG) is used as a source of Ga. Tri-methyl aluminum (TMA) or tri-ethyl aluminum (TEA) is used as a source of Al. Tri-methyl indium (TMI) or tri-ethyl indium (TEI) is used as a source of In. Ammonia ($NH_3$) or hydrazine ($N_2H_4$) is used as a source of N.

As impurities in the n-type semiconductor layer 12, monosilane ($SiH_4$) or disilane ($Si_2H_6$) may be used as a source of Si, and germane (GeH4) or an organic germanium compound may be used as a source of Ge. In the p-type semiconductor layer, for example, biscyclopentadienyl magnesium ($Cp_2Mg$) or bisethylcyclopentadienyl magnesium (($EtCp)_2Mg$) may be used as a source of Mg.

Conductive Translucent Electrode (Positive Electrode: Transparent Conductive Film, for Example, IZO film) Forming Process Next, in the (b) conductive translucent electrode forming process, the positive electrode (conductive translucent electrode) 15 made of transparent conductive film such as an IZO film is formed on the p-type semiconductor layer 14 of the semiconductor layer formed in the semiconductor layer forming process.

Specifically, first, an amorphous transparent conductive film such as an IZO film is formed on the entire surface of the p-type semiconductor layer 14. As a method of forming the transparent conductive film such as an IZO film in this case, any method known in the art to form a thin film may be used if it can form the amorphous transparent conductive film. For example, a sputtering method or a vacuum deposition method may be used to form the film. However, the sputtering method is preferably used because particles or dust generated in formation of the film are hardly generated in comparison with the vacuum deposition method.

When the IZO film as the transparent conductive film is formed using the sputtering method, an $In_2O_3$ target and a ZnO target can be formed by performing a revolutionary deposition using an RF magnetron sputtering method. However, in order to increase a film formation speed, it is preferable that the power for the IZO target is applied according to the DC magnetron sputtering method. In addition, in order to reduce plasma damage on the p-type semiconductor layer 14, an electric discharge output of the sputter is preferably less than or equal to 1,000 W.

Etching Process

Next, in the (c) etching process, the amorphous transparent conductive film such as an IZO film formed through the conductive translucent electrode forming process is etched in a predetermined shape.

Specifically, the area of the transparent conductive film except for the area of the positive electrode 15 on the p-type semiconductor layer 14 is removed by patterning the transparent conductive film such as an IZO film using the photolithography method or an etching method known in the art, thereby forming the transparent conductive film on the area of the positive electrode 15 as shown in FIG. 2.

The etching process for patterning the transparent conductive film, for example, the etching process for patterning the IZO film is preferably performed before the heat treatment process which will be described below. Since the amorphous transparent conductive film such as an IZO film is changed into a crystallized transparent conductive film (for example, the IZO film) by performing patterning process after the heat treatment, it becomes difficult to perform etching in comparison with the amorphous transparent conductive film (for example, the IZO film). On the contrary, since the transparent conductive film (for example, the IZO film) before the heat treatment has an amorphous state, it is possible to readily etch it with high accuracy using an etching solution known in the art. For example, in the case of the IZO film, when an etching solution ITO-07N (manufactured by Kanto Chemical Co., Inc.) is used, it is possible to perform the etching at a rate of 40 nm/min. Therefore, burrs or overetching are hardly generated.

In addition, the etching of the amorphous transparent conductive film such as an IZO film may be performed using a dry etcher. In this case, as an etching gas, $Cl_2$, $SiCl_4$, $BCl_3$, or the like may be used.

In addition, the surface of the amorphous transparent conductive film such as an IZO film may be concavo-convex using the photolithography method or the etching method described above as shown in FIGS. 5A, 5B, and 6. For example, in the case of the IZO film, when an etching solution ITO-07N is used, an embossing having a depth of 40 nm can be formed for 1 minute as an etching time.

As shown in FIGS. 5A, 5B, and 6, it is possible to improve the optical transmittance of the positive electrode and the light-emitting output of the light-emitting element by embossing the surface of the transparent conductive film, for example, IZO film using an etching method. It is envisaged that the light-emitting output is improved by embossing the surface of the transparent conductive film, for example, IZO film because (1) the optical transmittance is improved by the thin positive electrode, (2) the area of the light extraction face (the surface area of the transparent conductive film) increases by the embossing treatment, and (3) the total reflection at the surface of the positive electrode is reduced. In addition, any bossing shape of the surface of the transparent conductive film, for example, IZO film can provide the output improvement effect due to the aforementioned reasons (1) to (3). Particularly, the embossing having a dot shape is more preferable as shown in FIGS. 5A, 5B, and 6 because the area of the embossing surface can increase.

Generally, since the increasing film thickness makes the sheet resistance of the conductive translucent electrode to be lowered and makes the electric current flowing through the film to easily diffuse to the entire area of the electrode, it is preferable that the surface is formed in a concavo-convex shape in which the electric current can easily flow through the convex portions. For this reason, the dot shape is preferably formed such that independent concavo portions are provided as shown in FIGS. 5A and 5B rather than independent convex portions as shown in FIG. 6. In addition, if the area of the concavo portion is less than or equal to ¼ of the area of the convex portion, the improvement effect of the light-emitting output is reduced. If the area of the concavo portion is greater than or equal to ¾ of the area of the convex portion, it becomes difficult for the electric current to diffuse, and the driving voltage increases. Therefore, the area of the concavo portion is preferably ranging from ¼ to ¾ of the area of the convex portion.

In order to extract an amount of light from the concavo-convex side surface, the film thickness of the concavo portion is preferably less than or equal to ½ of the film thickness of the convex portion. However, when the transparent conductive film such as an IZO film of the concavo portion is perfectly etched, i.e., when the film thickness of the concavo portion of the transparent conductive film such as an IZO film is 0 nm, the light can be extracted from the semiconductor layer (the p-type semiconductor layer side) without passing through the transparent conductive film such as an IZO film. Therefore, the light-emitting output can be effectively improved. In addition, since the transparent conductive film can be etched within an etching time nearly the same as that of the patterning, it is possible to simultaneously perform both the patterning and the embossing processes for the transparent conductive film and reduce the process time. However, when the transparent conductive film of the concavo portion is perfectly etched, the contact area between the transparent conductive film and the p-type semiconductor layer is reduced. Therefore, a driving voltage of the light-emitting element may increase. Accordingly, the transparent conductive film of which the concavo portion has a film thickness of 0 nm, i.e., the concavo portion is perfectly etched may be used only when the light-emitting output has a higher priority than the driving voltage of the light-emitting element.

In the aforementioned embossing process, the photolithography method may be used without limitation as described above in conjunction with the patterning of the transparent conductive film. However, when it is desired to further improve the light-emitting output, it is preferable to form smaller embossings using a g-ray or i-ray stepper, a nano-imprint device, a laser exposure device, an EB (electron beam) exposure device, or the like. In addition, similar to the patterning of the transparent conductive film, the embossing process of the transparent conductive film is preferably performed before the heat treatment process which will be described below.

Heat Treatment

Next, in the (d) heat treatment process, a heat treatment is performed on the transparent conductive film that has been patterned in the aforementioned etching process.

Specifically, the heat treatment is performed for the patterned transparent conductive film while controlling the retention time within a temperature range of 300 to 800° C., thereby allowing the transparent conductive film to contain crystals composed of $In_2O_3$ having a hexagonal crystal structure and controlling the carrier mobility in the film to 30 $cm^2/V \cdot sec$ or more to obtain the positive electrode 15.

In the (d) heat treatment process, the heat treatment may be formed for the surface of the IZO film that has been patterned in the etching process.

Specifically, the heat treatment is performed for the patterned IZO film while controlling the retention time within a temperature range of 500 to 800° C., thereby allowing the IZO film to contain crystals composed of $In_2O_3$ having a hexagonal crystal structure and controlling the carrier mobility in the film to 30 $cm^2/V \cdot sec$ or more to obtain the positive electrode 15.

The amorphous transparent conductive film becomes a crystallized transparent conductive film by performing the heat treatment within a temperature range, for example, from 300 to 800° C. As such, by crystallizing the transparent conductive film, it is possible to improve the optical transmittance of the light-emitting element across the luminescent wavelength, for example, from the visible light range to the ultraviolet light range. Particularly, the optical transmittance is remarkably improved within a wavelength range of 380 to 500 nm.

The amorphous IZO film becomes a crystallized IZO film surface by performing the heat treatment within a temperature range, for example, from 500 to 800° C. As such, by crystallizing the IZO film, it is possible to improve the optical transmittance of the light-emitting element across the luminescent wavelength, for example, from the visible light range to the ultraviolet light range. Particularly, the optical transmittance is remarkably improved within a wavelength range of 380 to 500 nm.

In addition, as described above, since it is difficult to etch the crystallized transparent conductive film such as an IZO film, it is preferable that the heat treatment is performed after the etching process.

In addition, the heat treatment of the transparent conductive film such as an IZO film is performed under an $O_2$-free atmosphere. The $O_2$-free atmosphere may include an inert gas atmosphere such as $N_2$ or a mixed gas atmosphere containing an inert gas such as $N_2$ and $H_2$, and preferably $N_2$ atmosphere or a mixed gas atmosphere containing $N_2$ and $H_2$. For example, as apparent from the "Experiment 1" in the following examples, it is possible crystallize the IZO film and also effectively reduce the sheet resistance of the IZO film by performing the heat treatment of the IZO film under $N_2$ atmosphere or a mixed gas atmosphere containing $N_2$ and $H_2$ or under a vacuum atmosphere. Particularly, when the sheet resistance of the transparent conductive film such as an IZO film is reduced, it is preferable that the heat treatment of the sheet resistance of the transparent conductive film such as an IZO film is performed under a mixed gas atmosphere containing $N_2$ and $H_2$. In this case, the ratio between $H_2$ and $N_2$ under the mixed gas atmosphere is preferably ranging from 100:1 to 1:100.

In contrast, for example, when the heat treatment of the transparent conductive film such as an IZO film is performed under an $O_2$ atmosphere, the sheet resistance of the transparent conductive film such as an IZO film increases. As such, it is envisaged that the sheet resistance of the transparent conductive film such as an IZO film increases when the heat treatment is performed under an $O_2$ atmosphere because the oxygen vacancy in the transparent conductive film such as an IZO film is reduced. It is envisaged that the conductivity of the transparent conductive film such as an IZO film is exhibited because electrons functioning as carriers are generated due to presence of the oxygen vacancy within the transparent conductive film such as an IZO film. However, it is envisaged that, since the number of the oxygen vacancies generating the carrier electrons is reduced by the heat treatment, a carrier concentration in the transparent conductive film such as an IZO film is reduced, and the sheet resistance increases.

The heat treatment temperature of the transparent conductive film is preferably ranging from 300 to 800° C. When the heat treatment for the transparent conductive film is performed at a temperature lower than 300° C., the transparent conductive film may not be sufficiently crystallized, and the optical transmittance of the transparent conductive film such as an IZO film may not be sufficiently high.

In addition, when the heat treatment for the transparent conductive film is performed at a temperature higher than 800° C., the transparent conductive film is crystallized, but the optical transmittance thereof may not be sufficiently high. In addition, when the heat treatment is performed at a temperature higher than 800° C., the semiconductor layer underlying the transparent conductive film may be degraded.

The heat treatment temperature of the IZO film is preferably ranging from 500 to 800° C. When the heat treatment for the IZO film is performed at a temperature lower than 500° C., the IZO film may not be sufficiently crystallized, and the optical transmittance of the IZO film may not be sufficiently high. When the heat treatment for the IZO film is performed at a temperature higher than 800° C., the IZO film is crystallized, but the optical transmittance thereof may not be sufficiently high. In addition when the heat treatment is performed at a temperature higher than 800° C., the semiconductor layer underlying the IZO film may be degraded.

As described above, when the transparent conductive film such as an IZO film containing $In_2O_3$ crystals having a hexagonal crystal structure is used as the conductive translucent electrode (positive electrode), the driving voltage of the light-emitting element is reduced. Therefore, it is preferable that the crystallized transparent conductive film such as an IZO film contains $In_2O_3$ crystals having a hexagonal crystal structure. The reason for the driving voltage of the light-emitting element being reduced when the transparent conductive film such as an IZO film contains $In_2O_3$ crystals having a hexagonal crystal structure is not clear. However, it is guessed that it is because contact resistance in a contact interface between the p-type semiconductor layer and the positive electrode made of the transparent conductive film such as an IZO film is reduced when it contains $In_2O_3$ crystals having a hexagonal crystal structure.

In order to allow the transparent conductive film such as an IZO film to contain $In_2O_3$ crystals having a hexagonal crystal structure as described above, a heat treatment is preferably performed for the transparent conductive film such as an IZO film. However, the heat treatment condition is different depending on a deposition method or a composition of the transparent conductive film such as an IZO film. For example, when an IZO film is formed as the transparent conductive film, the crystallization temperature is lowered by reducing a concentration of Zn within the IZO film. Therefore, it is possible to form the IZO film containing $In_2O_3$ crystals having a hexagonal crystal structure by performing the heat treatment at a lower temperature. For this reason, the preferable heat treatment temperature changes depending on the concentration of Zn within the IZO film.

In addition, while in the present embodiment, the transparent conductive film such as an IZO film is crystallized using a heat treatment process, any method that can crystallize the transparent conductive film such as an IZO film may be used without limitation. For example, the transparent conductive film such as an IZO film may be crystallized using a method of using an RTA annealing furnace, a laser annealing method, a method of irradiating an electronic beam, or the like.

The transparent conductive film such as an IZO film crystallized using the heat treatment exhibits excellent adhesion property to the p-type semiconductor layer 14 or the positive electrode bonding pad 16 in comparison with the amorphous transparent conductive film such as an IZO film. Therefore, it is possible to prevent a yield from decreasing due to exfoliation during a process of manufacturing the light-emitting element or the like. In addition, the crystallized transparent conductive film such as an IZO film reacts less with water in the air and has a superior chemical resistance against acid or the like in comparison with the amorphous transparent conductive film such as an IZO film. As a result, property degradation is also reduced even in an integrity test over a long time.

In the heat treatment process provided in the manufacturing method according to the present embodiment, the transparent conductive film such as an IZO film is controlled to contain crystals composed of $In_2O_3$ having a hexagonal crystal structure and have a carrier mobility within the film greater than or equal to 30 $cm^2/V \cdot sec$, and more preferably, ranging from 30 to 100 $cm^2/V \cdot sec$ by performing the heat treatment for the transparent conductive film such as an IZO film under the aforementioned sequence and condition. Therefore, it is possible to form a positive electrode 15 having highly excellent optical transmittance from the visible light range to the ultraviolet range and a low resistance.

Formation of Negative Electrode

Next, the n-type semiconductor layer 12 is exposed by partially removing the semiconductor layer including the n-type semiconductor layer 12, the light-emitting layer 13, and the p-type semiconductor layer 14 provided in the process of forming the semiconductor layer, and a negative electrode 17 is formed.

Specifically, as shown in FIGS. 1 and 2, a part of the n-type semiconductor layer 12 is exposed by partially removing the p-type semiconductor layer 14, the light-emitting layer 13, and the n-type semiconductor layer 12 through etching, and the negative electrode 17 made of, for example, Ti/Au is formed on the exposed n-type semiconductor layer 12 using a method known in the related art.

Formation of Positive Electrode Bonding Pad

Next, a positive electrode bonding pad 16 is formed on the transparent conductive film such as an IZO film included in the positive electrode (conductive translucent electrode) 15.

Specifically, as shown in FIGS. 1 and 2, the positive electrode bonding pad 16 is formed of a material such as Au, Al, Ni, and Cu on at least a part of the transparent conductive film (positive electrode 15) such as an IZO film (positive electrode 15) according to the method known in the related art.

Formation of Protection Layer

Next, according to the present embodiment, in order to prevent oxidation of the transparent conductive film such as an IZO film included in the positive electrode 15, a protection layer (not shown) is formed on the positive electrode 15.

Specifically, the protection layer is formed of a translucent insulation material such as $SiO_2$ or $Al_2O_3$ on the positive electrode 15 using a method known in the art to cover the entire area except for the area of the positive electrode bonding pad 16.

Dicing of Semiconductor Wafer

Next, the semiconductor wafer 10 where the positive electrode 15, the positive electrode bonding pad 16, and the negative electrode 17 are formed on the semiconductor layer in the aforementioned sequence is made to have a mirror surface by grinding the back face of the substrate 11. Then, light-emitting element chips (the compound semiconductor light-emitting element 1) can be provided by cutting the semiconductor wafer 10, for example, into squares having a length of 350 μm.

The method of manufacturing the compound semiconductor light-emitting element according to the present embodiment described above includes: a semiconductor layer forming process for manufacturing the semiconductor wafer 10 by sequentially stacking each of the layers that are made of a compound semiconductor on a substrate 11; a conductive translucent electrode stacking process for stacking an amorphous transparent conductive film such as an IZO film on the p-type semiconductor layer 14; an etching process for etching the transparent conductive film such as an IZO film in a predetermined shape; and a heat treatment process in which a heat treatment is performed for the transparent conductive film while controlling a retention time within a temperature range of 300 to 800° C. (for example, in the case of the IZO film, the heat treatment is performed while controlling a retention time within a temperature range of 500 to 800° C.), thereby allowing the transparent conductive film such as an IZO film to contain crystals composed of $In_2O_3$ having a hexagonal crystal structure and have a carrier mobility greater than or equal to 30 $cm^2/V \cdot sec$ in the film. Therefore, it is possible to obtain the positive electrode (conductive translucent electrode) 15 having a low resistance and highly excellent optical transmittance from the visible light range to the ultraviolet range. It is possible to obtain the compound semiconductor light-emitting element 1 having a low driving voltage and highly excellent light-emitting output properties.

Lamp

In the compound semiconductor light-emitting element according to the present invention described above, a lamp can be configured by providing, for example, a transparent cover using means known in the art. In addition, it is possible to provide a white lamp by combining the cover having an electroluminescent body with the compound semiconductor light-emitting element according to the present invention.

The gallium nitride-based compound semiconductor light-emitting element according to the present invention may be configured as an LED lamp using a method known in the art without any limitation. The lamp may be used in whatever fields such as a dome type used for a general use, a side-view type used in a backlight unit in a mobile phone, and a top view type used in a display unit.

FIG. 4 is a schematic diagram illustrating an example of the lamp according to the present invention. In the lamp 30 shown in FIG. 4, the compound semiconductor light-emitting element 1 according to the present embodiment configured in a face-up type as described above is mounted in a dome type lamp. In the lamp 30 shown in FIG. 4, the light-emitting element 1 shown in FIG. 1 is bonded to one of two frames 31 and 32 using resin or the like, and the positive electrode bonding pad 16 and the negative electrode 17 are bonded to the frames 31 and 32, respectively, using wires 33 and 34 made of gold or the like. In addition, as shown in FIG. 4, a mold 35 made of transparent resin is formed around the light-emitting element 1.

In the lamp 30 described above, it is possible to provide a semiconductor compound light-emitting element 1 according to the present invention having excellent luminescent characteristic.

Electronic Device and Mechanical Apparatus

Since the lamp manufactured by using the compound semiconductor light-emitting element according to the present invention as described above has a high light-emitting output and a low driving voltage, it is possible to drive, with low power, electronic devices such as a mobile phone, a display, and panels including the lamp manufactured using such a technology or mechanical apparatuses such as vehicles, computers, and game machines including such electronic devices and implement high device characteristics and apparatus characteristics. Particularly, in devices such as mobile phones, game machines, toys, and vehicle components driven by a battery, the maximum power saving effect can be obtained.

EXAMPLES

Hereinafter, a compound semiconductor element and a method of manufacturing the same according to the present invention will be described in more detail with reference to the examples, but the invention is not limited thereto.

Experiment 1

Relationship between Sheet Resistance and Heat Treatment Temperature of IZO Film In the experiment 1, a relationship between the heat treatment (annealing) temperature of the IZO film and the sheet resistance of the IZO film after the heat treatment was investigated in the following sequence.

Specifically, the heat treatment was performed for the IZO film (having a thickness of 250 nm) formed on a sapphire substrate in an amorphous state under $N_2$ atmosphere at a temperature of 300 to 900° C., and the sheet resistance of the IZO film was measured. The result thereof is shown in the following table 1 and the graph of FIG. 7. In addition, the sheet resistance of the IZO film was measured using a 4-probe measurement device (Loresta MP MCP-T360 manufactured by Mitsubishi Chemical Co., Ltd.).

Figure 7:
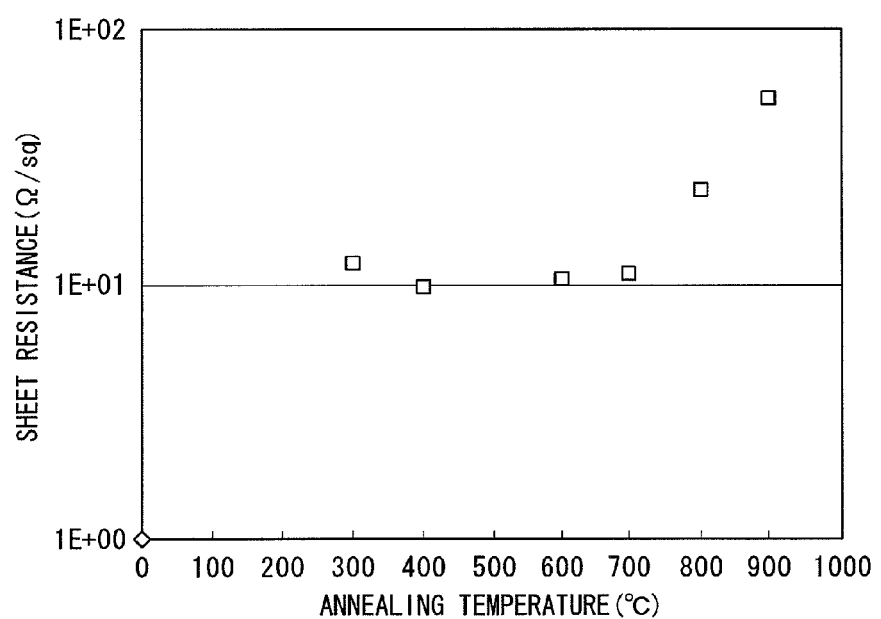
FIG. 7 illustrates an example of a compound semiconductor light-emitting element according to the present invention and is a graph illustrating a relationship between a heat treatment temperature and a sheet resistance of the IZO film.

From the results shown in Table 1 and FIG. 7, it is recognized that the sheet resistance is about 10 Ω/sq until the heat treatment temperature becomes 700° C. when the IZO film is annealed under $N_2$ atmosphere, and this represents excellent property. On the contrary, when the annealing is performed at a temperature of 800° C., the sheet resistance starts to increase. When the treatment temperature is 900° C., the sheet resistance becomes 53.2 Ω/sq. From this result, it is recognized that the sheet resistance abruptly increases as the annealing temperature increases over 800° C. In addition, the sheet resistance of the amorphous IZO film having a thickness of 250 nm before the annealing was 15 Ω/sq.

Experiment 2

Relationship between Heat Treatment Temperature, Carrier Concentration, and Mobility of IZO film In the experiment 2, the carrier concentration and the mobility of the IZO film manufactured in the experiment 1 were measured using van der Pauw's method. The resultant carrier concentration is shown in Table 1 and FIG. 8, and the resultant carrier mobility is shown in Table 1 and FIG. 9.

Figure 8:
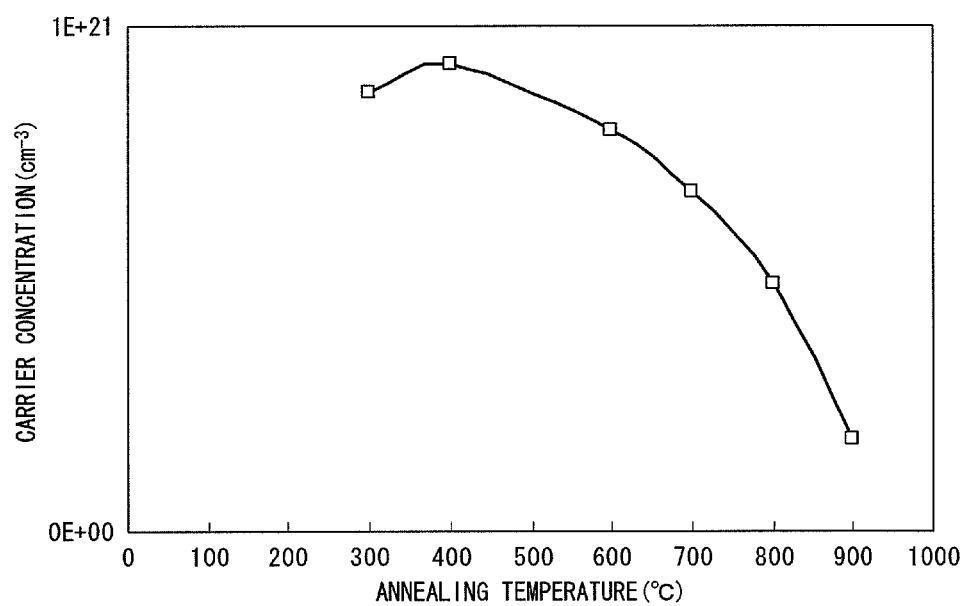
FIG. 8 illustrates an example of a compound semiconductor light-emitting element according to the present invention and is a graph illustrating a relationship between a carrier concentration and a heat treatment temperature for the IZO film.

Referring to the results shown in Table 1 and FIG. 8, when the annealing is performed for the IZO film under $N_2$ atmosphere at a treatment temperature of 700° C., the carrier concentration was $4.7 \times 10^{20}$ cm$^{-3}$. At a treatment temperature of 800° C., the carrier concentration was $3 \times 10^{20}$ cm$^{-3}$. Meanwhile, when the annealing was performed at a heat treatment temperature of 900° C., the carrier concentration of the IZO film was $1.5 \times 10^{20}$ cm$^{-3}$. Based on this result, it is recognized that the carrier concentration decreases as the treatment temperature of the annealing increases.

Figure 9:
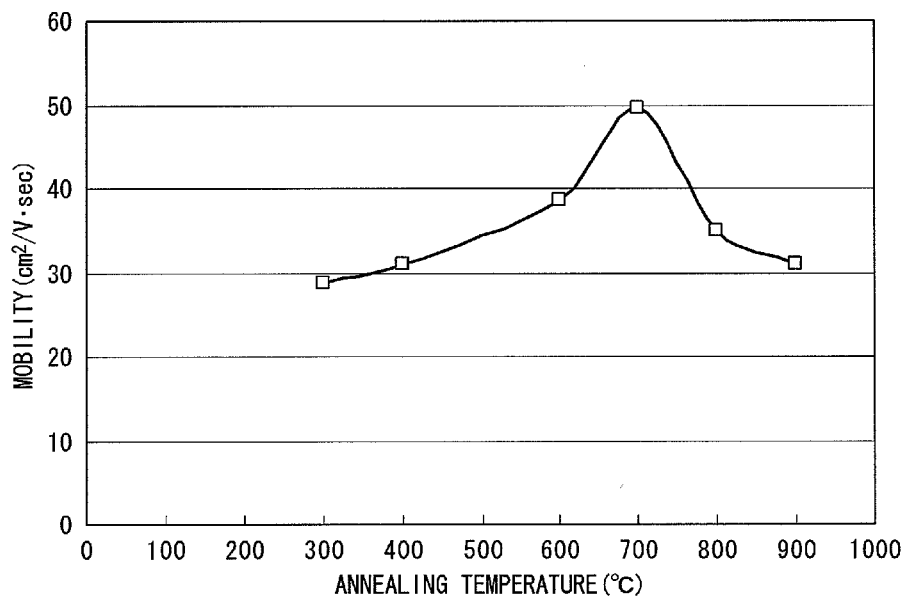
FIG. 9 illustrates an example of a compound semiconductor light-emitting element according to the present invention and is a graph illustrating a relationship between a mobility of the carrier and a heat treatment temperature for the IZO film.

Referring to the results of Table 1 and FIG. 9, it is recognized that, when the annealing is performed for the IZO film under $N_2$ atmosphere at a treatment temperature of 400° C., the carrier mobility was 30.9 cm$^2$/V·sec. At the treatment temperature of 600° C., the carrier mobility was 38.7 cm$^2$/V·sec. At the treatment temperature of 700° C., the carrier

TABLE 1

| No. | substrate | Annealing Condition (Heat treatment) | | | Hall Measurement | | |
| --- | --- | --- | --- | --- | --- | --- | --- |
| | | Temperature (° C.) | Atmosphere | Device | Temperature (K) | Resistivity (Ωcm) | Sheet resistance (Ω/sq) |
| 1 | Sapphire | 300 | $N_2$ | RTA | 300 | $2.95 \times 10^{-4}$ | 11.8 |
| 3 | Sapphire | 400 | $N_2$ | RTA | 300 | $2.40 \times 10^{-4}$ | 9.6 |
| 5 | Sapphire | 600 | $N_2$ | RTA | 300 | $2.60 \times 10^{-4}$ | 10.4 |
| 7 | Sapphire | 700 | $N_2$ | RTA | 300 | $2.69 \times 10^{-4}$ | 10.8 |
| 8 | Sapphire | 800 | $N_2$ | RTA | 300 | $5.78 \times 10^{-4}$ | 23.1 |
| 9 | Sapphire | 900 | $N_2$ | RTA | 300 | $1.33 \times 10^{-3}$ | 53.2 |

| No. | Hall Coefficient | Carrier concentration (cm$^{-3}$) | Sheet carrier concentration (cm$^{-3}$) | Mobility (cm$^2$/V·sec) | Carrier type |
| --- | --- | --- | --- | --- | --- |
| 1 | $8.5 \times 10^{-3}$ | $7.4 \times 10^{20}$ | $1.8 \times 10^{16}$ | 28.6 | N |
| 3 | $7.4 \times 10^{-3}$ | $8.4 \times 10^{20}$ | $2.1 \times 10^{16}$ | 30.9 | N |
| 5 | $1.0 \times 10^{-2}$ | $6.2 \times 10^{20}$ | $1.6 \times 10^{16}$ | 38.7 | N |
| 7 | $1.3 \times 10^{-2}$ | $4.7 \times 10^{20}$ | $1.2 \times 10^{16}$ | 49.5 | N |
| 8 | $2.0 \times 10^{-2}$ | $3.1 \times 10^{20}$ | $7.7 \times 10^{15}$ | 35.0 | N |
| 9 | $4.1 \times 10^{-2}$ | $1.5 \times 10^{20}$ | $3.8 \times 10^{15}$ | 30.9 | N | mobility was 49.5 cm$^2$/V·sec. In addition, the carrier mobility of the IZO film was 35 cm$^2$/V·sec at a treatment temperature of the annealing of 800° C. and 30.9 cm$^2$/V·sec at an treatment temperature of 900° C. From this result, it is recognized that a highest carrier mobility is obtained at the treatment temperature of the annealing of about 700° C., for example, 650 to 750° C., and the carrier mobility is abruptly reduced as the treatment temperature increases over 800° C.

Experiment 3

Relationship between Crystallization and Heat Treatment Temperature of IZO Film

In the experiment 3, the relationship between the crystallization and the heat treatment temperature of the IZO film was investigated in the following sequence.

In other words, X-ray diffraction data for the amorphous IZO film (having a thickness of 250 nm) formed on the GaN epitaxial wafer without the heat treatment were measured using an X-ray diffraction (XRD) method. Similarly, X-ray diffraction data for the amorphous IZO film formed on the GaN epitaxial wafer by performing the heat treatment under N$_2$ atmosphere at a temperature of 300 to 900° C. for one minute were measured, and the result thereof is shown in FIGS. 10 to 18. The aforementioned X-ray diffraction data are used as an index for crystallinity of the IZO film.

FIGS. 10 to 18 are graphs illustrating X-ray diffraction data of the IZO film, in which the horizontal axis denotes a diffraction angle (2θ(°)), and the vertical axis denotes a diffraction intensity (s).

Figure 10:
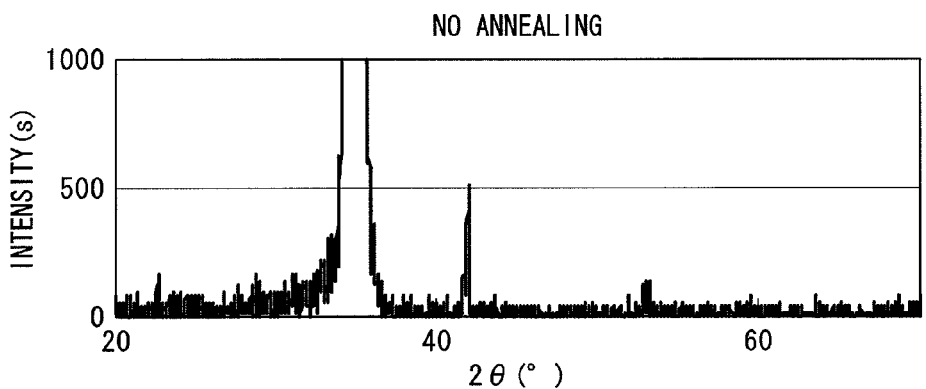
FIG. 10 illustrates an example of a compound semiconductor light-emitting element according to the present invention and is a graph illustrating X-ray diffraction data (XRD) of the IZO film where the heat treatment has not been performed.
Figure 11:
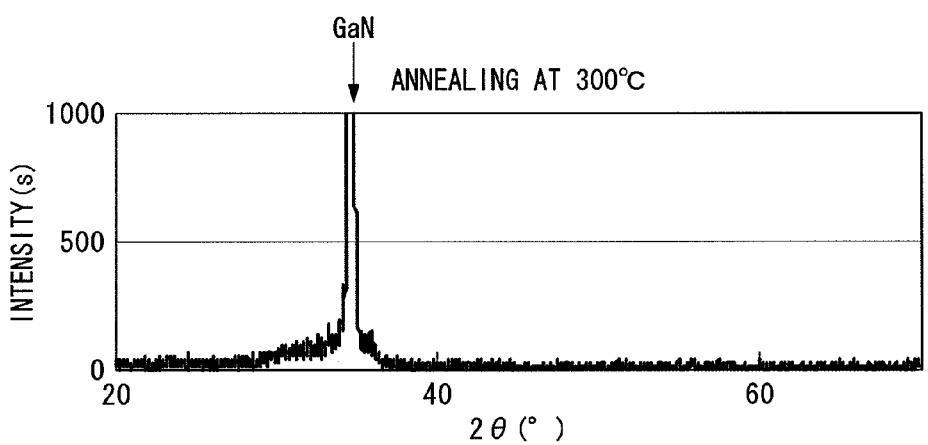
FIG. 11 illustrates an example of a compound semiconductor light-emitting element according to the present invention and is a graph illustrating X-ray diffraction data (XRD) of the IZO film where the heat treatment has been performed at a temperature of 300° C.
Figure 12:
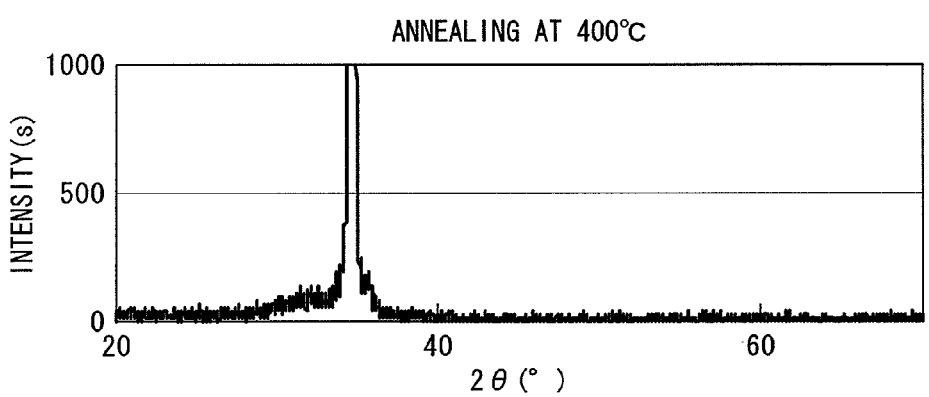
FIG. 12 illustrates an example of a compound semiconductor light-emitting element according to the present invention and is a graph illustrating X-ray diffraction data (XRD) of the IZO film where the heat treatment has been performed at a temperature of 400° C.
Figure 13:
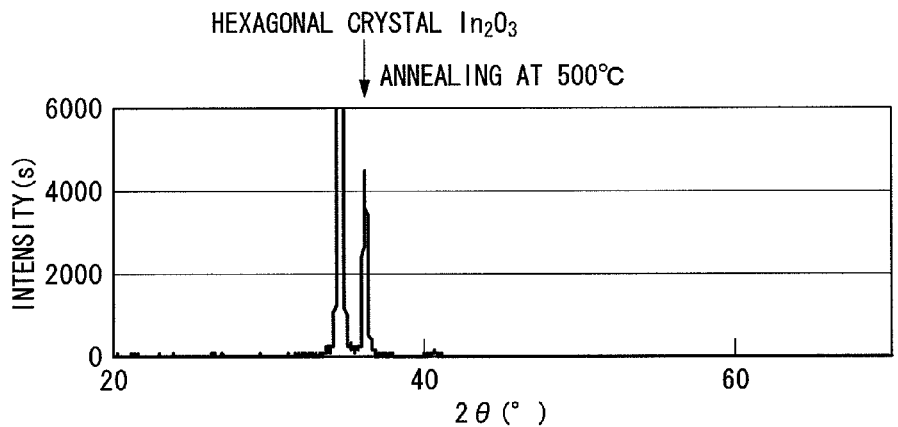
FIG. 13 illustrates an example of a compound semiconductor light-emitting element according to the present invention and is a graph illustrating X-ray diffraction data (XRD) of the IZO film where the heat treatment has been performed at a temperature of 500° C.

As shown in FIGS. 10 to 12, in the IZO film before the heat treatment and the IZO film subjected to the heat treatment at a temperature of 300 or 400° C., a broad X-ray peak was observed, which represents an amorphous state. From this observation result, it is recognized that the IZO film before the heat treatment and the IZO film subjected to the heat treatment at a temperature equal to or lower than 400° C. have an amorphous state.

Figure 14:
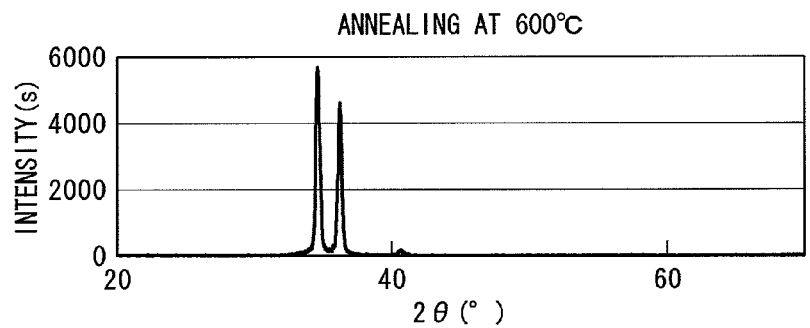
FIG. 14 illustrates an example of a compound semiconductor light-emitting element according to the present invention and is a graph illustrating X-ray diffraction data (XRD) of the IZO film where the heat treatment has been performed at a temperature of 600° C.
Figure 15:
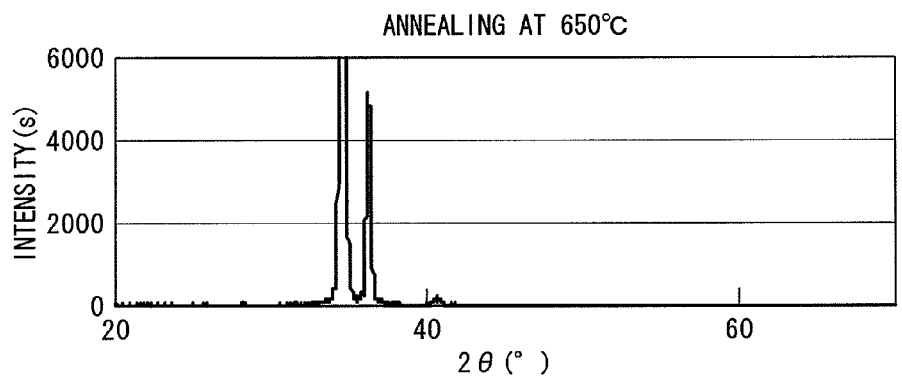
FIG. 15 illustrates an example of a compound semiconductor light-emitting element according to the present invention and is a graph illustrating X-ray diffraction data (XRD) of the IZO film where the heat treatment has been performed at a temperature of 650° C.
Figure 16:
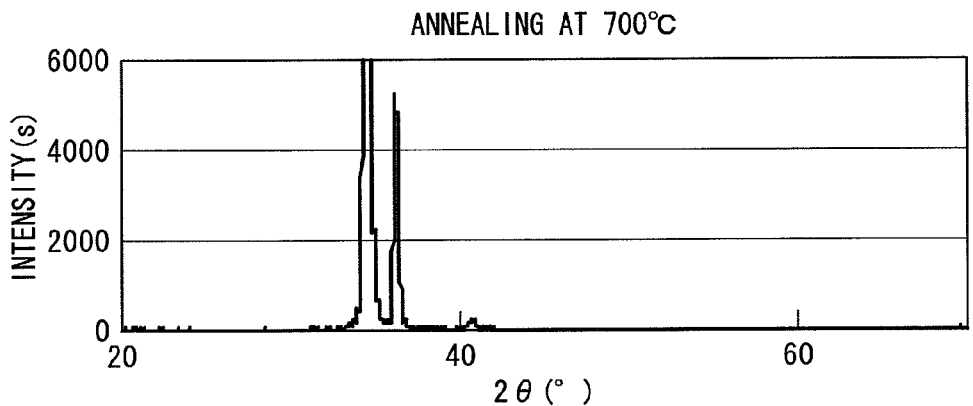
FIG. 16 illustrates an example of a compound semiconductor light-emitting element according to the present invention and is a graph illustrating X-ray diffraction data (XRD) of the IZO film where the heat treatment has been performed at a temperature of 700° C.
Figure 17:
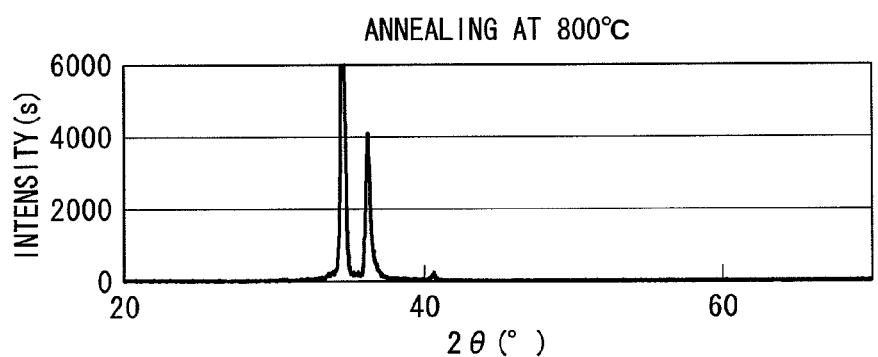
FIG. 17 illustrates an example of a compound semiconductor light-emitting element according to the present invention and is a graph illustrating X-ray diffraction data (XRD) of the IZO film where the heat treatment has been performed at a temperature of 800° C.

In addition, as shown in FIGS. 13 to 17, in the IZO film subjected to the heat treatment at a temperature of 500 to 800° C., an X-ray peak representing the crystallization peak was observed. From this observation result, it is recognized that the IZO film subjected to the heat treatment at a temperature of 500 to 800° C. has been crystallized. In addition, as shown in FIGS. 14 to 16, a very high X-ray peak intensity was observed, particularly, at a temperature of 600 to 650 to 700° C. Therefore, it is recognized that the IZO film becomes a film containing crystals composed of In$_2$O$_3$ having a hexagonal crystal structure by performing the heat treatment at this temperature range.

Figure 18:
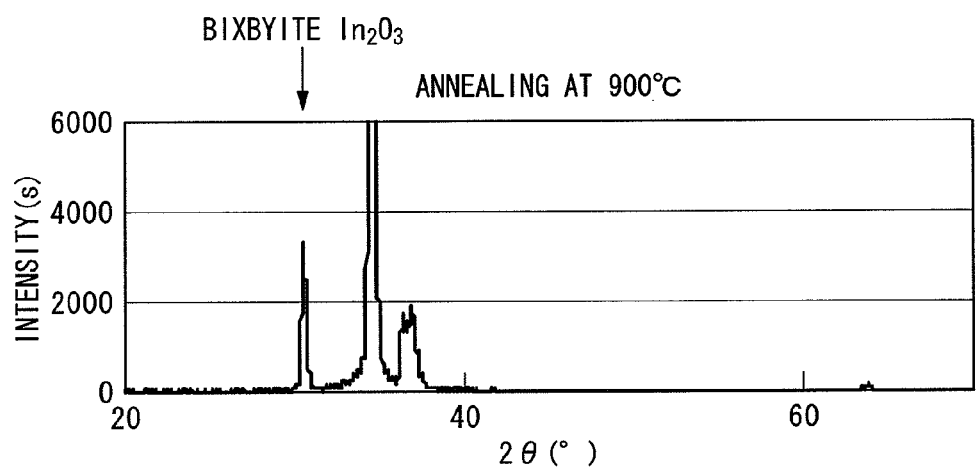
FIG. 18 illustrates an example of a compound semiconductor light-emitting element according to the present invention and is a graph illustrating X-ray diffraction data (XRD) of the IZO film where the heat treatment has been performed at a temperature of 900° C.

In addition, as shown in FIG. 18, in the IZO film subjected to the heat treatment at a temperature of 900° C., a peak representing the bixbyite structure was observed, which was not observed at a heat treatment temperature equal to or lower than 800° C.

From this observation result, it is recognized that the crystal structure within the IZO film subjected to the heat treatment at a temperature of 900° C. is transmitted from the hexagonal crystal structure to the bixbyite structure.

Experiment 4

Relationship between Optical Transmittance and Heat Treatment Temperature of IZO Film In the experiment 4, a relationship between the optical transmittance and the heat treatment temperature of the IZO film was investigated in the following sequence.

Figure 19:
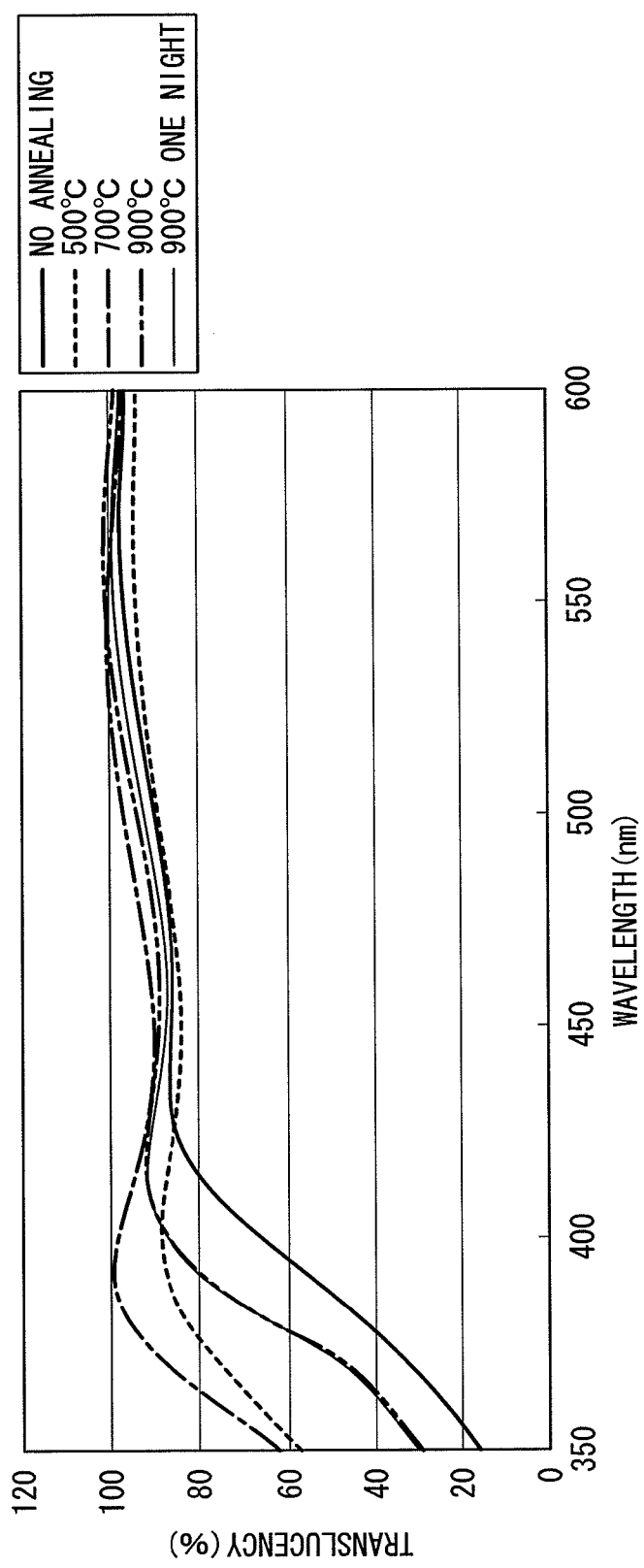
FIG. 19 illustrates an example of a compound semiconductor light-emitting element according to the present invention and is a graph illustrating a relationship between a transparent wavelength and an optical transmittance of the IZO film when the heat treatment has not been performed and when the heat treatment has been performed at a predetermined temperature.

Specifically, the optical transmittance was measured for both the amorphous IZO film formed (having a thickness of 250 nm) on the sapphire substrate without the heat treatment and the IZO film subjected to the heat treatment at each temperature of 500, 700, and 900° C., and the results are shown in the graph of FIG. 19. In the measurement of the optical transmittance of the IZO film, an ultraviolet-visible light spectrophoto-meter (model No. UV-2450 manufactured by Shimadzu Corporation) was used. In addition, the value of the optical transmittance was obtained by subtracting the light transmittance blank value obtained by measuring the optical transmittance of only the sapphire substrate.

FIG. 19 is a graph illustrating an optical transmittance of the IZO film, in which the horizontal axis denotes a wavelength (nm) and the vertical axis denotes an optical transmittance (%).

As shown in FIG. 19, it is recognized that the IZO film obtained by performing the heat treatment at a temperature of 700° C. has a higher optical transmittance that those of the IZO films obtained without the heat treatment or by performing the heat treatment at other temperatures. Particularly, it is recognized that, when the heat treatment was performed for the IZO film at a temperature of 700° C., the optical transmittance is high in the ultraviolet light range near a wavelength of 400 nm, and the optical transmittance is high in the blue light range near a wavelength of 460 nm.

Meanwhile, it is recognized that when the heat treatment is performed for the IZO film at a temperature of 900° C., the optical transmittance of the IZO film is not sufficiently high. Therefore, the heat treatment temperature of the IZO film is preferably ranging from 500 to 800° C., and more preferably, ranging from 650 to 700° C.

Example 1

Manufacturing Gallium Nitride-based Compound Semiconductor Light-emitting Element FIG. 3 is a schematic cross-sectional diagram illustrating a semiconductor wafer including a gallium nitride-based compound semiconductor layer manufactured for the gallium nitride-based compound semiconductor light-emitting element of the present example. FIGS. 1 and 2 are a schematic cross-sectional diagram and a schematic top plan view, respectively, illustrating the gallium nitride-based compound semiconductor light-emitting element manufactured for the present example. Hereinafter, the example 1 will be described with reference to FIGS. 1 to 3.

A stack structure of the semiconductor wafer 20 made of a gallium nitride-based compound was configured by sequentially stacking an undoped GaN base layer (layer thickness=2 μm) 22, an Si-doped n-type GaN contact layer (layer thickness=2 μm, carrier concentration=1×10$^{19}$ cm$^{-3}$) 23, an Si-doped n-type Al$_{0.07}$Ga$_{0.93}$N-clad layer (layer thickness=12.5 nm, carrier concentration=1×10$^{18}$ cm$^{-3}$) 24, a light-emitting layer 25 of a multi-quantum well structure including a 6-layered Si-doped GaN barrier layer (layer thickness=14.0 nm, carrier concentration=1×10$^{18}$ cm$^{-3}$) and a 5-layered undoped In$_{0.20}$Ga$_{0.80}$N-well layer (layer thickness=2.5 nm), an Mg-doped p-type Al$_{0.07}$Ga$_{0.93}$N-clad layer (layer thickness 10 nm) 26, and an Mg-doped p-type GaN contact layer (layer thickness=100 nm) 27 on the substrate 21 made of a c-plane ((0001)-crystal plane) of sapphire with interposing a buffer layer (not shown) made of AlN. Each layer 22 to 27 of the gallium nitride-based compound semiconductor wafer 20 was grown using a typical reduced-pressure MOCVD means.

Next, a gallium nitride-based compound semiconductor light-emitting element (refer to FIG. 1) was manufactured using the aforementioned semiconductor wafer 20. First, the surface of the p-type GaN contact layer 27 of the semiconductor wafer 20 was cleaned using HF and HCl, and then, the IZO film was formed on the p-type GaN contact layer 27 using a sputtering method. The IZO film was formed using a DC magnetron sputter to have a thickness of approximately 250 nm. In the sputtering, the IZO film was formed using an IZO target having a ZnO concentration of 10 mass % by introducing an Ar gas of 70 sccm under a pressure of approximately 0.3 Pa.

The sheet resistance of the IZO film formed using the aforementioned method was 17 Ω/sq. In addition, it was recognized that the IZO film immediately after the film was formed was amorphous through the X-ray diffraction (XRD).

After forming the IZO film, the IZO film was made to remain only in the area of the positive electrode on the p-type GaN contact layer 27 using a photolithography method and a wet etching. In this case, the amorphous IZO film was etched with an etching rate of, approximately, 40 nm/min using an etching solution ITO-07N. As a result, the positive electrode (refer to the reference numeral 15 in FIGS. 1 and 2) of the present invention was formed on the p-type GaN contact layer 27.

After patterning the IZO film through a wet etching through the aforementioned sequence, a heat treatment was performed for 30 seconds at a temperature of 700° C. using an RTA annealing furnace. In addition, the heat treatment of the IZO film was performed after making the inside of the RTA annealing furnace $N_2$ gas atmosphere by performing purging operations several times using the $N_2$ gas before raising the temperature.

The IZO film subjected to the heat treatment had a higher optical transmittance than that of the IZO film immediately after it is formed within a wavelength range of 350 to 600 nm, and the sheet resistance thereof was 10 Ω/sq. It was recognized that the IZO film was crystallized in a hexagonal crystal structure because, in the X-ray diffraction (XRD) measurement after the heat treatment, an X-ray peak of the $In_2O_3$ crystals having a hexagonal crystal structure was detected in most cases.

Next, a corresponding part of the surface of the Si-doped n-type GaN contact layer was exposed by performing a typical dry etching for the area of the negative electrode (refer to the reference numeral 12 of FIG. 1). Then, on a part of the IZO film (positive electrode) and the exposed portion of the Si-doped n-type GaN contact layer 23, a first layer (layer thickness=40 nm) made of Cr, a second layer (layer thickness=100 nm) made of Ti, and a third layer (layer thickness=400 nm) made of Au are sequentially stacked (referred to a Cr/Ti/Au stack structure) through a vacuum deposition method, thereby forming the positive electrode bonding pad and the negative electrode. In addition, another same Cr/Ti/Au stack structure was formed as the positive electrode bonding pad and the negative electrode except that the Ti layer is changed into a Pt layer (having the same layer thickness), and the thickness of the Au layer was changed into 1100 nm.

After forming the positive electrode bonding pad and the negative electrode, the back face of the sapphire substrate was polished using abrasive particles of a diamond powder and finally finished as a mirror surface. Then, the semiconductor wafer 20 was diced into independent square chips having a length of 350 μm, and the chip was mounted on a lead frame and connected to the lead frame by a gold (Au) interconnection.

(Measurement of Driving Voltage (Vf) and Light-Emitting Output (Po))

For the aforementioned chip, a forward voltage drop (the driving voltage: Vf) was measured by flowing an electric current of 20 mA through probes. In addition, the light-emitting output (Po) and the light-emitting wavelength were measured using a typical integration sphere. It was recognized that the light is emitted from the entire area of the positive electrode based on the light distribution on the light-emitting plane.

The chip has a light-emitting wavelength range of about 460 nm, the driving voltage Vf was 3.1 V and the light-emitting output Po was 18.5 mW.

Comparison Example 1 and Examples 2 to 6

Another same gallium nitride-based compound semiconductor light-emitting element as that of the example 1 (700° C.) was manufactured and evaluated in a similar way to Example 1 except that the heat treatment temperature of the IZO film was performed at temperatures of 300° C. (comparison example 1), 400° C. (example 2), 500° C. (example 3), 600° C. (example 4), 800° C. (example 5), and 900° C. (example 6), respectively.

Figure 20:
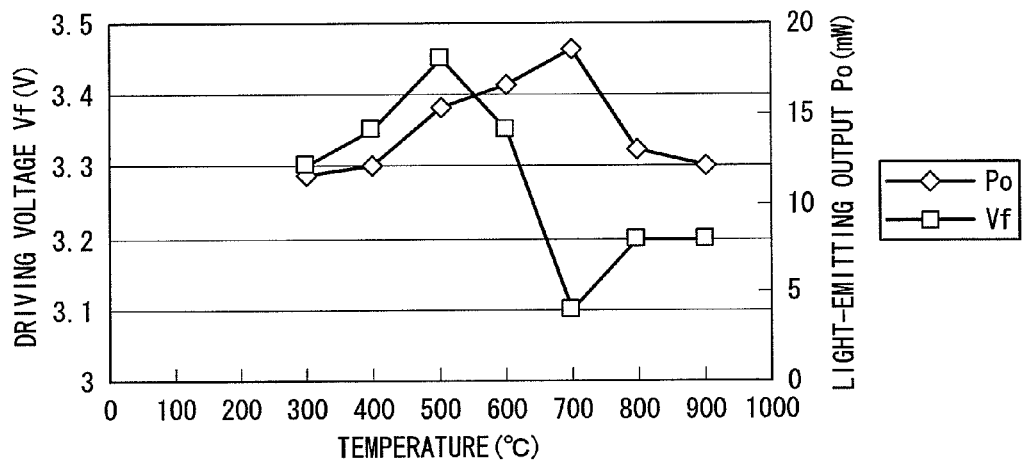
FIG. 20 illustrates an example of a compound semiconductor light-emitting element according to the present invention and is a graph illustrating a relationship between the heat treatment temperature, a driving voltage (Vf) of the light-emitting element, and the light-emitting output (Po) of the IZO film.

The graph of FIG. 20 shows a relationship between the heat treatment temperature of the IZO film, the driving voltage Vf of the light-emitting element, and the light-emitting output Po. The horizontal axis denotes the heat treatment temperature (° C.) of the IZO film, and the vertical axis denotes Vf (V) and Po (mW) of the light-emitting element.

As shown in the graph of FIG. 20, it was recognized that the light-emitting output Po of the light-emitting element increases when the heat treatment is performed for the IZO film at a temperature greater than or equal to 500° C., and the driving voltage Vf is lowered by 0.2 V when the heat treatment is performed at a temperature of 700° C. in comparison with the case where the heat treatment is not performed.

Example 7

Another same gallium nitride-based compound semiconductor light-emitting element as that of the example 1 was manufactured and evaluated in a similar way to the example 1 except that the concavo-convex shape is formed on the surface not making contact with the p-type semiconductor layer of the IZO film, i.e., the light extraction face side.

In a process of forming the concavo-convex shape, a wet etching was performed using an ITO-07N etching solution in a similar way to the patterning of the IZO film before the heat treatment of the IZO film. The concavo-convex shape is a circular cylindrical concavo portion having a diameter of 2 μm and a depth of 150 nm, and the circular cylindrical concavo portions are arranged in a staggered shape with a center pitch of 3 μm.

The driving voltage Vf of the light-emitting element obtained through the aforementioned process was 3.1 V, and the light-emitting output Po was 19.3 mW.

Examples 8 and 9

Another same gallium nitride-based compound semiconductor light-emitting element as that of the example 7 was manufactured and evaluated in a similar way to the example 1 except that depth of the circular cylindrical concavo portion was set to 200 nm and 250 nm.

Figure 21:
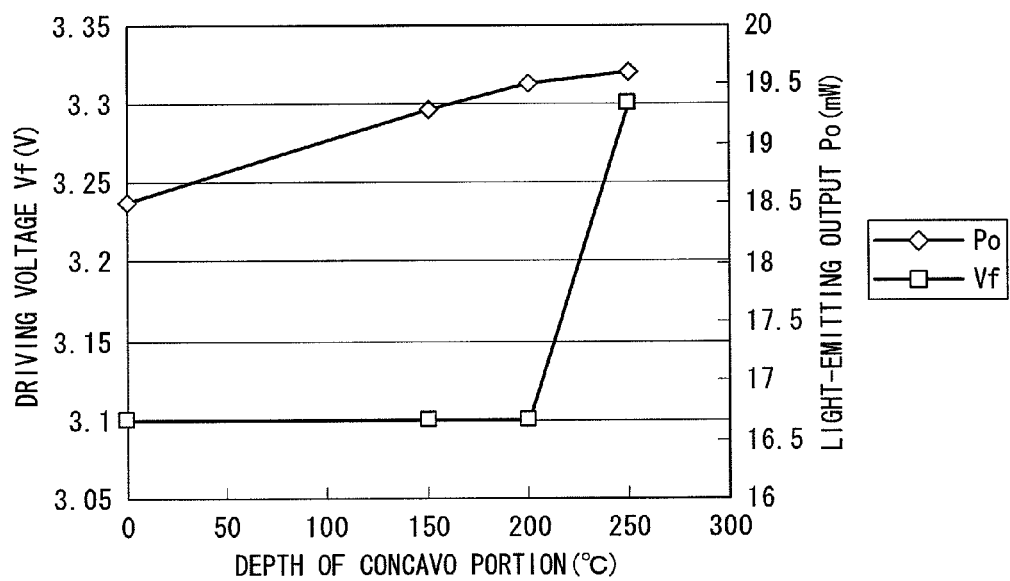
FIG. 21 illustrates an example of a compound semiconductor light-emitting element according to the present invention and is a graph illustrating a relationship between a depth of the concavo portion of the concavo-convex shape formed on a surface of the IZO film, a driving voltage (Vf) of the light-emitting element, and the light-emitting output (Po) of the IZO film.

The graph of FIG. 21 shows a relationship between the depth of the concavo portion on the surface of the IZO film, the driving voltage Vf of the light-emitting element, and the light-emitting output Po. In FIG. 21, the horizontal axis denotes the depth (nm) of the concavo portion on the surface of the IZO film, and the vertical axis denotes the driving voltage Vf (V) of the light-emitting element, and the light-emitting output Po (mW) of the gallium nitride-based compound semiconductor light-emitting element. In addition, when the depth of the concavo portion on the surface of the IZO film is zero, it means that the concavo-convex shape is not formed (as in the example 1).

As shown in the graph of FIG. 21, it was recognized that the light-emitting output Po increases as the depth of the concavo portion formed on the surface in the side not making contact with the p-type semiconductor layer of the IZO film increases, and the driving voltage Vf of the light-emitting element increases when the depth of the concavo portion is 250 nm, i.e., when the surface of the p-type semiconductor layer of the light-emitting element is exposed.

Example 10

Another same gallium nitride-based compound semiconductor light-emitting element as that of the example 1 was manufactured except that an ITO film (formed to have a thickness of approximately 250 nm using a sputtering method) is used instead of the IZO film as a material of the positive electrode, and the heat treatment temperature is 600° C. In addition, the sheet resistance of the ITO film was 15 Ω/sq.

A relationship between the heat treatment temperature of the ITO film and the crystallization was investigated as described below.

Figure 22:
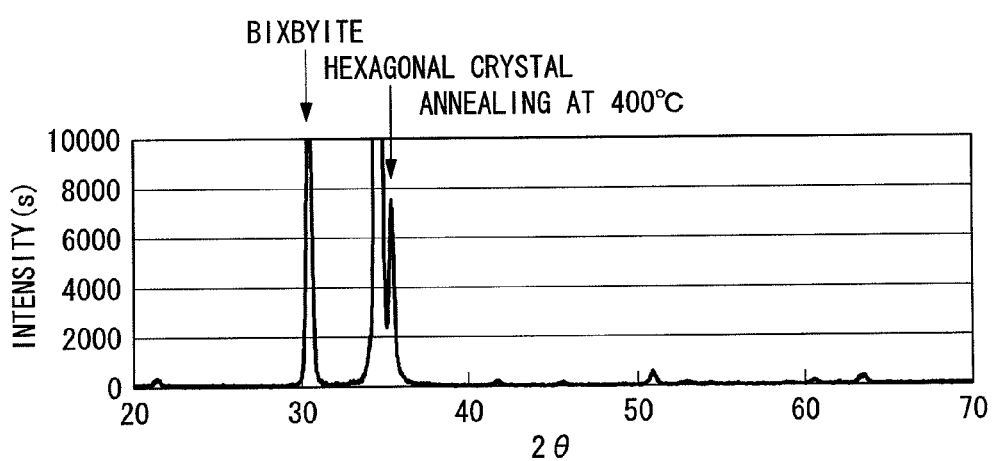
FIG. 22 is a graph illustrating X-ray diffraction data (XRD) of the ITO film where the heat treatment has been performed at a temperature of 400° C.
Figure 23:
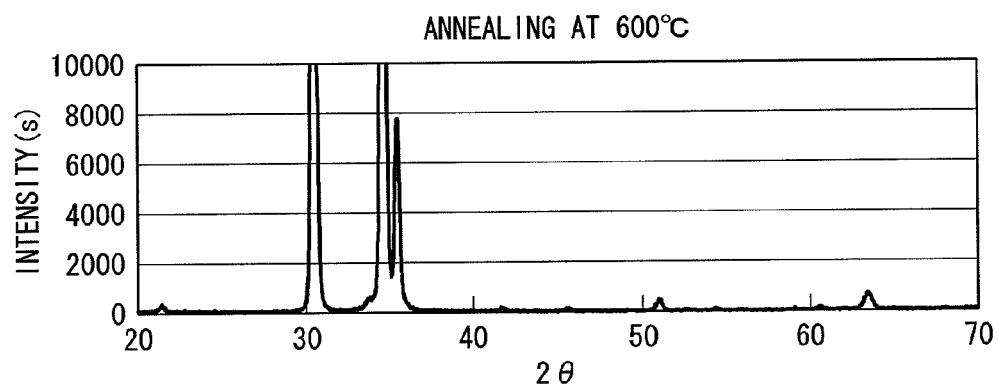
FIG. 23 is a graph illustrating X-ray diffraction data (XRD) of the ITO film where the heat treatment has been performed at a temperature of 600° C.

Specifically, an amorphous ITO film (having a thickness of 250 nm) was formed on a GaN epitaxial wafer, and the X-ray diffraction data were measured by performing the heat treatment for the resultant amorphous ITO film at a temperature of 400° C. or 600° C. under $N_2$ atmosphere for one minute. The result is shown in the graph of FIGS. 22 and 23. The aforementioned X-ray diffraction data are used as an index of the crystallinity of the ITO film.

FIGS. 22 and 23 are graphs illustrating the X-ray diffraction data of the ITO film, in which the horizontal axis denotes a diffraction angle (2θ(°)), and the vertical axis denotes a diffraction intensity (s).

As shown in FIGS. 22 and 23, in the ITO film subjected to the heat treatment at a temperature of 400° C. or 600° C., a peak having a hexagonal crystal structure and a peak having a $In_2O_3$ bixbyite structure were observed. From this observation result, it is recognized that the crystal structure of the ITO film contains crystals composed of $In_2O_3$ having a hexagonal crystal structure by performing the heat treatment at a temperature of 400 to 600° C.

Example 11

Another same gallium nitride-based compound semiconductor light-emitting element as that of the example 1 was manufactured except that the an IGO film (formed to have a thickness of about 250 nm using a sputtering method) was used as a material of the positive electrode instead of the IZO film, and the heat treatment temperature was set to 600° C. In addition, the sheet resistance of the IGO film was 40 Ω/sq.

In addition, as described below, a relationship between the heat treatment temperature of the IGO film and the crystallization was investigated.

Specifically, an amorphous IGO film (having a thickness of 250 nm) was formed on a GaN epitaxial wafer, and X-ray diffraction data of the IGO film obtained without the heat treatment were measured using an X-ray diffraction (XRD) method. Similarly, X-ray diffraction data were measured by performing the heat treatment for the amorphous IGO film formed on the GaN epitaxial wafer at temperatures of 200° C., 400° C., and 600° C. at $N_2$ atmosphere for one minute, and the result is shown in graphs of FIGS. 24 to 27. The aforementioned X-ray diffraction data are used as an index of the crystallinity of the IGO film.

FIGS. 24 to 27 are graphs illustrating X-ray diffraction data of the IGO film, in which the horizontal axis denotes a diffraction angle (2θ(°)), and the vertical axis denotes a diffraction intensity (s).

Figure 24:
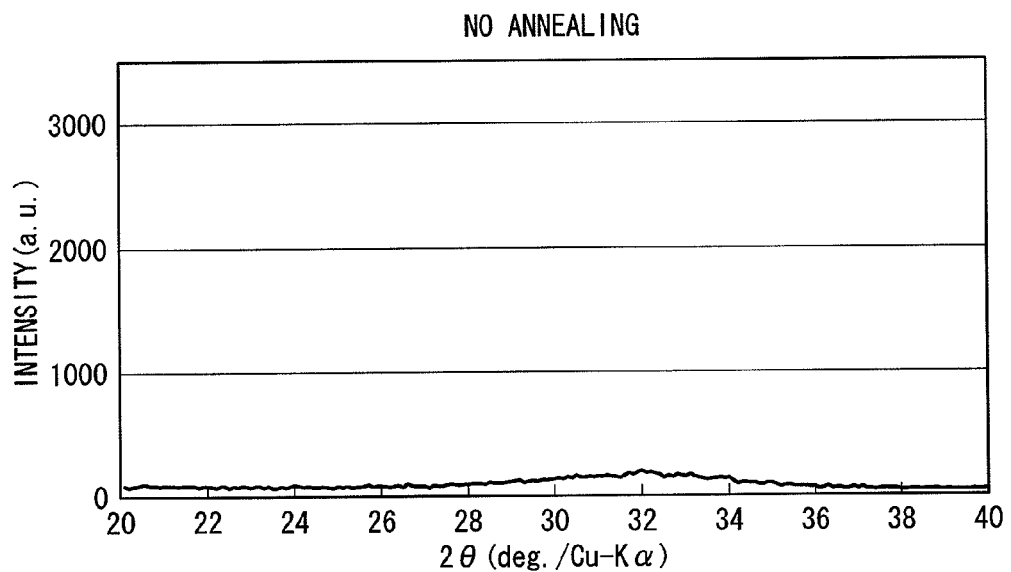
FIG. 24 is a graph illustrating X-ray diffraction data (XRD) of the IGO film where the heat treatment has not been performed.
Figure 25:
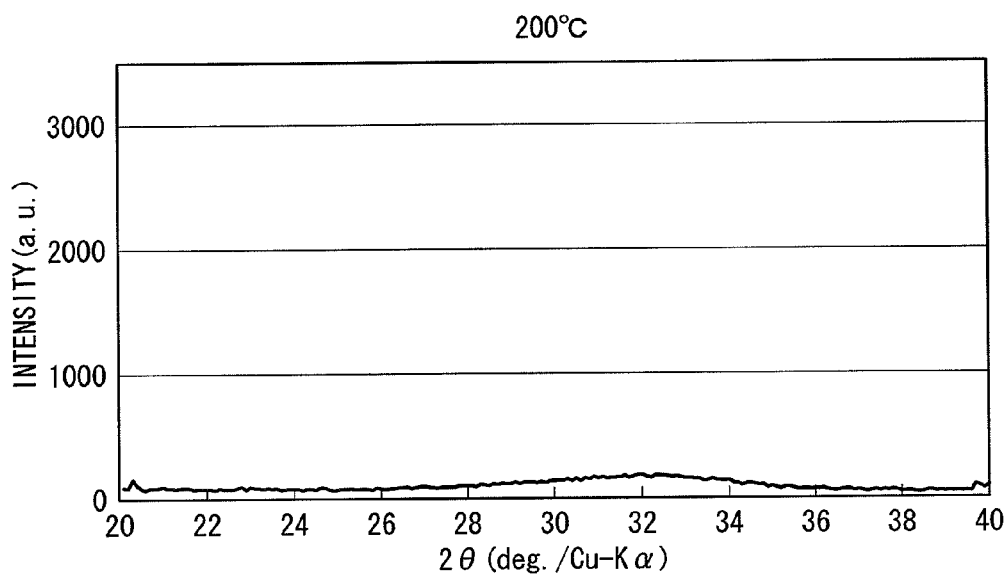
FIG. 25 is a graph illustrating X-ray diffraction data (XRD) of the IGO film where the heat treatment has been performed at a temperature of 200° C.
Figure 26:
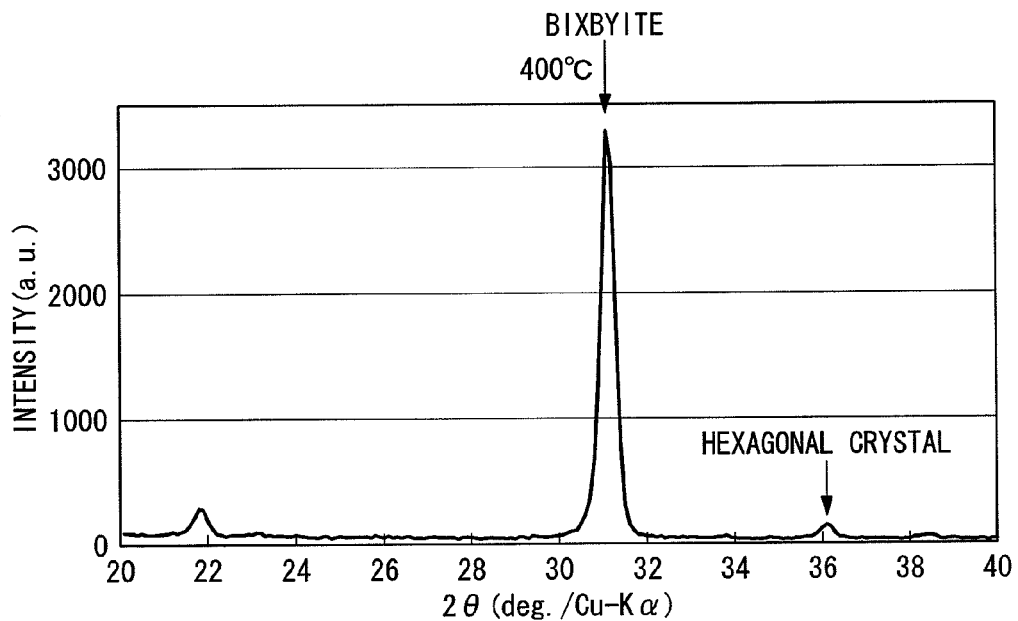
FIG. 26 is a graph illustrating X-ray diffraction data (XRD) of the IGO film where the heat treatment has been performed at a temperature of 400° C.
Figure 27:
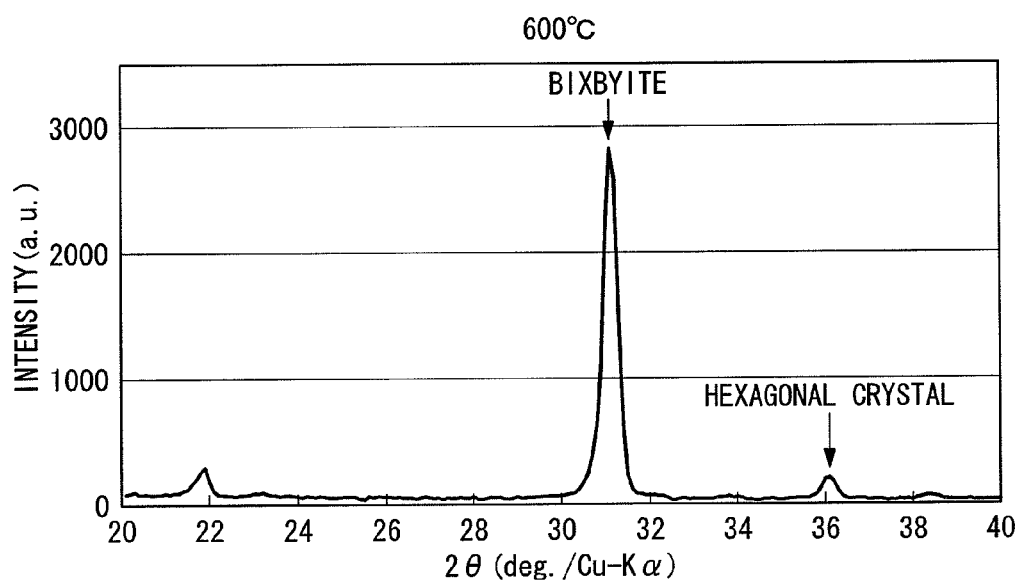
FIG. 27 is a graph illustrating X-ray diffraction data (XRD) of the IGO film where the heat treatment has been performed at a temperature of 600° C.

As shown in FIGS. 24 and 25, a broad X-ray peak representing the amorphous state was observed in the IGO film before the heat treatment and the IGO film subjected to the heat treatment at a temperature of 200° C. In addition, as shown in FIGS. 26 and 27, in the IGO film subjected to the heat treatment at a temperature of 400° C. or 600° C., a peak representing the hexagonal crystal structure and a peak representing the bixbyite structure were observed. From this observation result, it is recognized that the crystal structure of the IGO film contains crystals composed of $In_2O_3$ having a hexagonal crystal structure by performing the heat treatment at a temperature of 400° C. to 600° C.

From the aforementioned result, it is clearly recognized that the compound semiconductor light-emitting element according to the present invention includes a positive electrode made of a conductive translucent electrode having a high optical transmittance, and it is advantageous to the light-emitting element.

The invention of claimed is:

1. A compound semiconductor light-emitting element comprising:
   a substrate on which an n-type semiconductor layer, a light-emitting layer and a p-type semiconductor layer that are made of a compound semiconductor are stacked in this order;
   a positive electrode made of a conductive translucent electrode; and
   a negative electrode made of a conductive electrode, wherein
   the conductive translucent electrode of the positive electrode is made of a crystalized IZO film, wherein
   the IZO film contains crystals composed of $In_2O_3$ having a hexagonal crystal structure.

2. The compound semiconductor light-emitting element according to claim 1, wherein a carrier mobility in the IZO film is greater than or equal to 30 $cm^2$/V·sec.

3. The compound semiconductor light-emitting element according to claim 1, wherein a carrier concentration in the IZO film is ranging from $1 \times 10^{20}$ to $5 \times 10^{21}$ $cm^{-3}$.

4. The compound semiconductor light-emitting element according to claim 1, wherein the IZO film has a sheet resistance less than or equal to 50 Ω/sq.

5. The compound semiconductor light-emitting element according to claim 1, wherein the IZO film has a thickness of 35 nm to 10,000 nm (10 μm).

6. The compound semiconductor light-emitting element according to claim 1, wherein the IZO film has a concavo-convex surface.

7. The compound semiconductor light-emitting element according to claim 6, wherein a plurality of independent concavo portions are provided on a surface of the IZO film.

8. The compound semiconductor light-emitting element according to claim 7, wherein a total area of the concavo portions of the IZO film is ranging from ¼ to ¾ of an area of the entire IZO film.

9. The compound semiconductor light-emitting element according to claim 6, wherein a thickness of the IZO film at the concavo portion of the IZO film is less than or equal to ½ of a thickness of the IZO film at a convex portion.

10. The compound semiconductor light-emitting element according to claim 1, wherein a content of ZnO within the IZ0 film is ranging from 1 to 20 mass %.

11. The compound semiconductor light-emitting element according to claim 1, wherein the compound semiconductor is a gallium nitride-based compound semiconductor.

12. The compound semiconductor light-emitting element according to claim 1, wherein the positive electrode made of a conductive translucent electrode is provided on the p-type semiconductor layer, and the negative electrode made of the conductive electrode is provided on the n-type semiconductor layer.

13. A lamp, comprising the compound semiconductor light-emitting element according to claim 1.

14. An electronic device, comprising the lamp according to claim 13.

15. A mechanical apparatus, comprising the electronic device according to claim 14.

16. A conductive translucent electrode for a compound semiconductor light-emitting element, comprising
at least one IZO film containing crystals composed of $In_2O_3$ having a hexagonal crystal structure, wherein
a carrier mobility in the film is greater than or equal to 30 $cm^2/V \cdot sec$.

17. The conductive translucent electrode for the compound semiconductor light-emitting element according to claim 16, wherein the carrier mobility in the film is ranging from 30 to 100 $cm^2/V \cdot sec$.

18. The conductive translucent electrode for the compound semiconductor light-emitting element according to claim 16, wherein a carrier concentration within the film is ranging from $1 \times 10^2$ to $5 \times 10^{21}$ $cm^{-3}$.

* * * * *